(12) United States Patent
Moon et al.

(10) Patent No.: US 12,707,830 B2
(45) Date of Patent: Aug. 11, 2026

(54) DISPLAY DEVICE

(71) Applicant: Samsung Display Co., Ltd., Yongin-si (KR)

(72) Inventors: Byungrok Moon, Yongin-si (KR); Shogo Nishizaki, Yongin-si (KR); Jaehyun Kim, Yongin-si (KR); Che Ho Lee, Yongin-si (KR); Wonje Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 360 days.

(21) Appl. No.: 18/478,705

(22) Filed: Sep. 29, 2023

(65) Prior Publication Data

US 2024/0138208 A1 Apr. 25, 2024
US 2024/0237428 A9 Jul. 11, 2024

(30) Foreign Application Priority Data

Oct. 19, 2022 (KR) ........................ 10-2022-0135161

(51) Int. Cl.
*H10K 59/124* (2023.01)
*H10K 59/80* (2023.01)

(52) U.S. Cl.
CPC ....... *H10K 59/124* (2023.02); *H10K 59/8731* (2023.02)

(58) Field of Classification Search
CPC ............. H10K 59/124; H10K 59/8731; H10K 59/1201; H10K 59/131; H10K 59/805; H10K 59/12; H10K 59/80; H10K 59/875; H10K 59/873; H10K 59/879; H10K 59/122; H10K 59/8051; H10K 59/8052;
(Continued)

(56) References Cited

U.S. PATENT DOCUMENTS 9,431,634 B2 8/2016 Song
9,614,015 B2 4/2017 Park et al.
11,088,232 B2 * 8/2021 Choi ................. H10K 59/8722
(Continued)

FOREIGN PATENT DOCUMENTS

EP 3483709 A1 5/2019
KR 10-1502206 B1 3/2015
(Continued)

*Primary Examiner* — Dao H Nguyen
(74) *Attorney, Agent, or Firm* — Womble Bond Dickinson (US) LLP

(57) ABSTRACT

A display device includes: a base layer with first and second areas; a pixel on the first area, wherein the pixel includes a pixel circuit and a light-emitting element, wherein the light-emitting element includes a first electrode, a light-emitting layer, and a second electrode; a first power electrode on the second area and configured to supply a first drive voltage to the pixel circuit; a second power electrode on the second area and configured to supply a second drive voltage to the second electrode; and an insulating layer between the base layer and the first electrode, wherein the insulating layer extends from the first area to the second area, and overlaps the first power electrode, wherein the second electrode extends from the first area toward the second area, and wherein the insulating layer covers an entirety of an overlapping portion of the first power electrode overlapping the second electrode.

24 Claims, 11 Drawing Sheets

(58) Field of Classification Search
CPC .. H10K 50/8445; H10K 50/805; H10K 50/85; G09F 9/335
See application file for complete search history.

(56) References Cited

U.S. PATENT DOCUMENTS

| | | | | |
|---|---|---|---|---|
| 11,195,884 | B2 | 12/2021 | Kim et al. | |
| 11,276,745 | B2 | 3/2022 | Bang et al. | |
| 2016/0093828 | A1* | 3/2016 | Kim | H10K 59/8731 257/40 |
| 2018/0205037 | A1* | 7/2018 | Kim | H10K 59/873 |
| 2020/0185647 | A1* | 6/2020 | Lee | G09G 3/3283 |
| 2021/0257433 | A1* | 8/2021 | Bang | H10K 59/8722 |
| 2022/0020833 | A1 | 1/2022 | Cho et al. | |
| 2022/0028955 | A1 | 1/2022 | Yoon et al. | |

FOREIGN PATENT DOCUMENTS

| | | | |
|---|---|---|---|
| KR | 10-2016-0066650 | A | 6/2016 |
| KR | 10-2020-0028567 | A | 3/2020 |
| KR | 10-2020-0097373 | A | 8/2020 |
| KR | 10-2021-0032614 | A | 3/2021 |
| KR | 10-2022-0010690 | A | 1/2022 |

* cited by examiner 1100
110A1
110A2
CE_P
CE_E
DM1
DM2
DM3
153
151
50
40
30
20
10
BFL
120
110
I'
I
DR3
DR1
DR2
PDLup
OILup
OLP
TK
PE1b
PE1a
PE1
152
CE_B
CPL
CE
PDL
OIL
60

1100
DR3
DR1
DR2
153
151
50
40
30
20
10
BFL
120
110
I'
DM3
DM2
DM1
110A2
CE_E
PDLup2
OILup
OLP
CE_P
PDLhop
PE1b
PE1a
PE1
110A1
I
152
CE_B
CPL
CE
PDL
OIL
60

1100
110A2
110A1
CE_P
CE_E
PDLup3
OILup1
PDLhm1
OILhm
DM1
DM2
DM3
153
151
50
40
30
20
10
BFL
120
110
I'
I
OLP
PE1b
PE1a
PE1
152
CE_B
CPL
CE
PDL
OIL
60
DR3
DR1
DR2

DISPLAY DEVICE

CROSS-REFERENCE TO RELATED APPLICATION

The present application claims priority to and the benefit of Korean Patent Application No. 10-2022-0135161 filed on Oct. 19, 2022, in the Korean Intellectual Property Office, the entire disclosure of which is incorporated herein by reference.

BACKGROUND

1. Field

Aspects of some embodiments of the present disclosure described herein relate to a display device having relatively improved light efficiency and product reliability.

2. Description of the Related Art

Various display devices used in multi-media devices such as televisions, mobile phones, navigation devices, and tablets are being developed. The display device may include an organic light-emitting element. The organic light-emitting element is a display element with a light-emitting layer made of an organic material and located between an anode and a cathode. Holes provided from the anode and electrons provided from the cathode are recombined with each other in the light-emitting layer to form excitons, and then light corresponding to energy between the holes and electrons is generated from the excitons.

The above information disclosed in this Background section is only for enhancement of understanding of the background and therefore the information discussed in this Background section does not necessarily constitute prior art.

SUMMARY

Aspects of some embodiments of the present disclosure include a display device having relatively improved light efficiency and product reliability.

According to some embodiments, a display device includes a base layer having a first area and a second area defined therein, a pixel on the first area, wherein the pixel may include a pixel circuit and a light-emitting element, wherein the light-emitting element may include a first electrode, a light-emitting layer, and a second electrode, a first power electrode on the second area and supplying a first drive voltage to the pixel circuit, a second power electrode on the second area and supplying a second drive voltage to the second electrode, and an insulating layer between the base layer and the first electrode, wherein the insulating layer extends from the first area to the second area, and overlaps the first power electrode, wherein the second electrode extends from the first area toward the second area, wherein the insulating layer covers an entirety of an overlapping portion of the first power electrode overlapping the second electrode.

According to some embodiments, the insulating layer may include an organic material.

According to some embodiments, a thickness of a portion of the insulating layer covering the overlapping portion of the first power electrode may be 0.7 micrometers or greater.

According to some embodiments, the display device may further include a pixel defining film on the insulating layer, wherein an opening exposing a portion of the first electrode may be defined in the pixel defining film, wherein the pixel defining film may overlap the overlapping portion of the first power electrode.

According to some embodiments, a portion of the pixel defining film overlapping the overlapping portion of the first power electrode may have a flat upper surface.

According to some embodiments, a concave groove may be defined in an upper surface of a portion of the pixel defining film overlapping the overlapping portion of the first power electrode.

According to some embodiments, a portion of the insulating layer covering the overlapping portion of the first power electrode may have a flat upper surface.

According to some embodiments, the display device may further include a capping layer on the second electrode.

According to some embodiments, the display device may further include an encapsulation layer on the first area and the second area so as to cover the pixel, at least a portion of the first power electrode, and at least a portion of the second power electrode.

According to some embodiments, the encapsulation layer may include a first inorganic encapsulation layer, an organic encapsulation layer on the first inorganic encapsulation layer, and a second inorganic encapsulation layer on the organic encapsulation layer.

According to some embodiments, the first inorganic encapsulation layer may include a first sub-inorganic encapsulation layer having a first refractive index, a second sub-inorganic encapsulation layer on the first sub-inorganic encapsulation layer and having a second refractive index different from the first refractive index, and a third sub-inorganic encapsulation layer on the second sub-inorganic encapsulation layer and having a third refractive index different from the first and second refractive indices, wherein the first refractive index may be lower than each of the second refractive index and the third refractive index.

According to some embodiments, the third refractive index may be lower than the second refractive index.

According to some embodiments, a thickness of the first sub-inorganic encapsulation layer may be smaller than a thickness of the second sub-inorganic encapsulation layer and may be greater than a thickness of the third sub-inorganic encapsulation layer.

According to some embodiments, a refractive index of the second inorganic encapsulation layer may be equal to the second refractive index of the second sub-inorganic encapsulation layer.

According to some embodiments, the first power electrode may include an electrode layer having a three-layer structure of a titanium layer/an aluminum layer/a titanium layer, wherein the first electrode may include an electrode layer having a three-layer structure of an indium tin oxide layer/a silver layer/an indium tin oxide layer.

According to some embodiments, a display device includes a display panel having a display area and a non-display area defined therein, wherein the display panel includes a base layer, a circuit layer on the base layer, wherein the circuit layer includes a pixel circuit, a first power electrode, a second power electrode, and an insulating layer covering the pixel circuit, the first power electrode, and the second power electrode, an element layer on the circuit layer, and electrically connected to the pixel circuit, wherein the element layer includes a light-emitting element including a first electrode, a light-emitting layer, and a second electrode, and an encapsulation layer covering the element layer, wherein the encapsulation layer includes a first inorganic encapsulation layer including a plurality of sub-inorganic encapsulation layers having different refractive indices, an organic encapsulation layer on the first inorganic encapsulation layer, and a second inorganic encapsulation layer on the organic encapsulation layer, wherein in the non-display area, an entirety of an overlapping portion of the first power electrode overlapping the second electrode is covered with the insulating layer.

According to some embodiments, the plurality of sub-inorganic encapsulation layers may include a first sub-inorganic encapsulation layer on the element layer and having a first refractive index, a second sub-inorganic encapsulation layer on the first sub-inorganic encapsulation layer and having a second refractive index higher than the first refractive index, and a third sub-inorganic encapsulation layer on the second sub-inorganic encapsulation layer and having a third refractive index higher than the first refractive index and lower than the second refractive index.

According to some embodiments, the first power electrode may transfer a first drive voltage to the pixel circuit, wherein the second power electrode may transfer a second drive voltage to the second electrode.

According to some embodiments, the insulating layer may be made of an organic material, wherein a thickness of a portion of the insulating layer between the second electrode and the first power electrode may be 0.7 micrometer or greater.

According to some embodiments, the display panel further may include a pixel defining film on the circuit layer, wherein an opening exposing a portion of the first electrode may be defined in the pixel defining film, wherein the pixel defining film may overlap the overlapping portion of the first power electrode.

According to some embodiments, a portion of the pixel defining film overlapping the overlapping portion of the first power electrode may have a flat upper surface.

According to some embodiments, a concave groove may be defined in an upper surface of a portion of the pixel defining film overlapping the overlapping portion of the first power electrode.

According to some embodiments, the first power electrode may include an electrode layer having a three-layer structure of a titanium layer/an aluminum layer/a titanium layer, wherein the first electrode may include an electrode layer having a three-layer structure of an indium tin oxide layer/a silver layer/an indium tin oxide layer.

According to some embodiments, a display device includes a base layer having a first area and a second area defined therein, a pixel on the first area, wherein the pixel includes a pixel circuit and a light-emitting element, wherein the light-emitting element includes a first electrode, a light-emitting layer, and a second electrode, a first power electrode on the second area and supplying a first drive voltage to the pixel circuit, a second power electrode on the second area and supplying a second drive voltage to the second electrode, and an insulating layer between the base layer and the first electrode, wherein the insulating layer extends from the first area to the second area, and overlaps the first power electrode, wherein an entirety of a portion of the second electrode between a boundary of the first area and the second area and an edge of the second electrode overlaps the insulating layer, wherein the portion of the second electrode is spaced apart from the first power electrode while the insulating layer is interposed therebetween.

According to some embodiments, the display device may further include an encapsulation layer on the first area and the second area so as to cover the pixel, at least a portion of the first power electrode, and at least a portion of the second power electrode, wherein the encapsulation layer may include a first inorganic encapsulation layer including a plurality of sub-inorganic encapsulation layers having different refractive indices, an organic encapsulation layer on the first inorganic encapsulation layer, and a second inorganic encapsulation layer on the organic encapsulation layer, wherein the plurality of sub-inorganic encapsulation layers may include a first sub-inorganic encapsulation layer having a first refractive index, a second sub-inorganic encapsulation layer on the first sub-inorganic encapsulation layer and having a second refractive index higher than the first refractive index, and a third sub-inorganic encapsulation layer on the second sub-inorganic encapsulation layer and having a third refractive index higher than the first refractive index and lower than the second refractive index.

BRIEF DESCRIPTION OF THE DRAWINGS

The above and other characteristics and features of the present disclosure will become apparent by describing in detail embodiments thereof with reference to the accompanying drawings.

DETAILED DESCRIPTION

Figure 1:
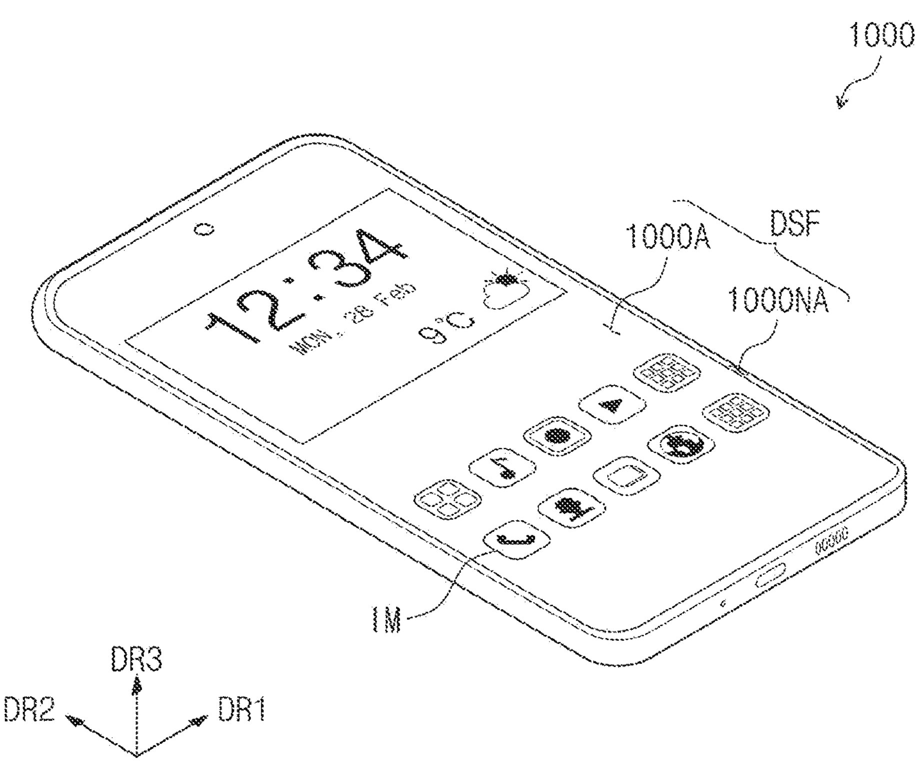
FIG. 1 is a perspective view of a display device according to some embodiments of the present disclosure.

As used herein, when a component (or a region, a layer, a portion, and the like) is referred to as being "on", "connected to", or "coupled to" another component, it means that the component may be directly located/connected/coupled on another component or a third component may be located between the component and another component.

Like reference numerals refer to like components. In addition, in the drawings, thicknesses, ratios, and dimensions of components are exaggerated for effective description of technical content. "and/or" includes all of one or more combinations that the associated components may define.

Terms such as first, second, and the like may be used to describe various components, but the components should not be limited by the terms. The above terms are used only for the purpose of distinguishing one component from another. For example, without departing from the scope of the present disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components illustrated in the drawings. The above terms are relative concepts, and are described with reference to directions indicated in the drawings.

It should be understood that terms such as "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described in more detail with reference to the drawings.

FIG. 1 is a perspective view of a display device 1000 according to some embodiments of the present disclosure.

Referring to FIG. 1, the display device 1000 may be a device activated according to an electrical signal. For example, the display device 1000 may be a mobile phone, a tablet, a car navigation system, a game machine, or a wearable device. However, embodiments according to the present disclosure are not limited thereto. FIG. 1 shows a case in which the display device 1000 is a mobile phone by way of example.

The display device 1000 may include a display face DSF defined by a first direction DR1 and a second direction DR2 intersecting the first direction DR1. The display device 1000 may display images IM to a user via the display face DSF. The display face DSF may include a display area 1000A and a non-display area 1000NA around the display area 1000A. The display area 1000A may display the images IM, and the non-display area 1000NA may not display the images IM. The non-display area 1000NA may surround the display area 1000A. For example, in some embodiments, the non-display area 1000NA may be in a periphery or outside a footprint of the display area 1000A. However, embodiments according to the present disclosure are not limited thereto, and a shape of the display area 1000A and a shape of the non-display area 1000NA may be modified.

Hereinafter, a direction substantially perpendicular or normal with respect to the plane defined by the first direction DR1 and the second direction DR2 is defined as a third direction DR3. Based on the third direction DR3, front and rear faces of each member are distinguished form each other. As used herein, "a plan view" may be defined as a view viewed in the third direction DR3.

Figure 2:
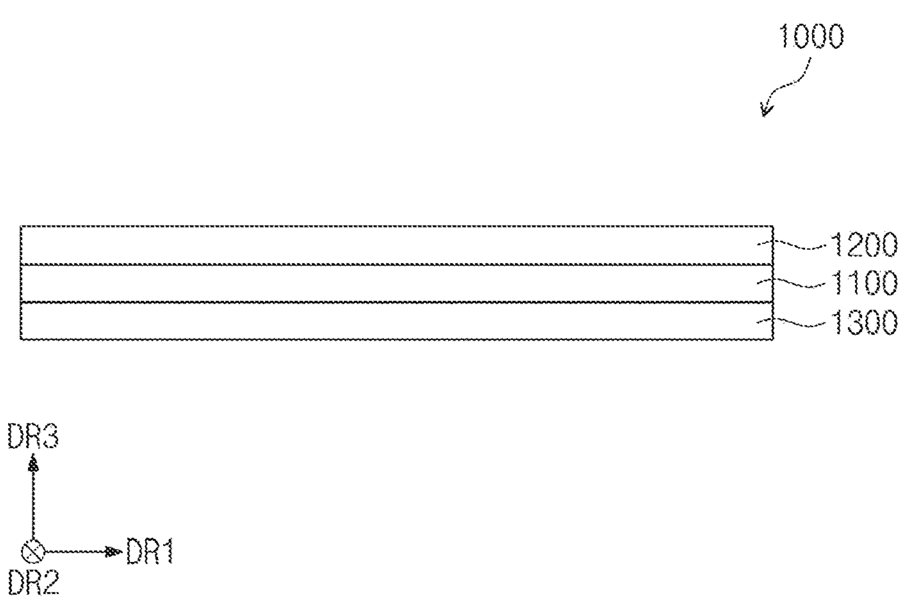
FIG. 2 is a schematic cross-sectional view of a display device according to some embodiments of the present disclosure.

FIG. 2 is a schematic cross-sectional view of the display device 1000 according to some embodiments of the present disclosure.

Referring to FIG. 2, the display device 1000 may include a display panel 1100, a window 1200, and a lower film 1300. The display device 1000 may include a structure in which the window 1200, the display panel 1100, and the lower film 1300 are sequentially stacked. According to some embodiments of the present disclosure, some of the above-described components may be omitted or other components may be further added. An adhesive layer may be located between the components, when necessary. The adhesive layer may be an optically clear adhesive (OCA) member, or a pressure-sensitive adhesive (PSA) film. However, embodiments according to the present disclosure are not particularly limited thereto. Each of adhesive layers as described below may include the same material as the above material or a conventional adhesive.

The display panel 1100 may display an image and detect an external input applied from an outside. The external input may include various types of inputs provided from the outside of the display device 1000. For example, the external input may include, for example, not only contact of a portion of a body such as the user's hand with the display device 1000, but also an external input (e.g., hovering) which is applied in a close manner to the display device 1000 or in an adjacent manner to the display device 1000 at a spacing (e.g., a set or predefined spacing). Further, the external input may take various forms, such as a force, a pressure, a temperature, and light. The external input may be provided from a separate device, for example, an active pen or a digitizer pen.

The window 1200 may be located on an upper surface of the display panel 1100. The window 1200 may include an optically transparent insulating material. For example, the window 1200 may be made of glass or plastic. The window 1200 may have a multi-layer structure or a single-layer structure. For example, the window 1200 may include a plurality of plastic films bonded to each other with an adhesive, or may include a glass substrate and a plastic film bonded to each other with an adhesive.

The lower film 1300 may be located on a bottom face of the display panel 1100. For example, the lower film 1300 may be a protective layer that blocks or absorbs light incident onto the display panel 1100. For example, the lower film 1300 may be a colored film. However, embodiments according to the present disclosure are not particularly limited thereto.

Figure 3:
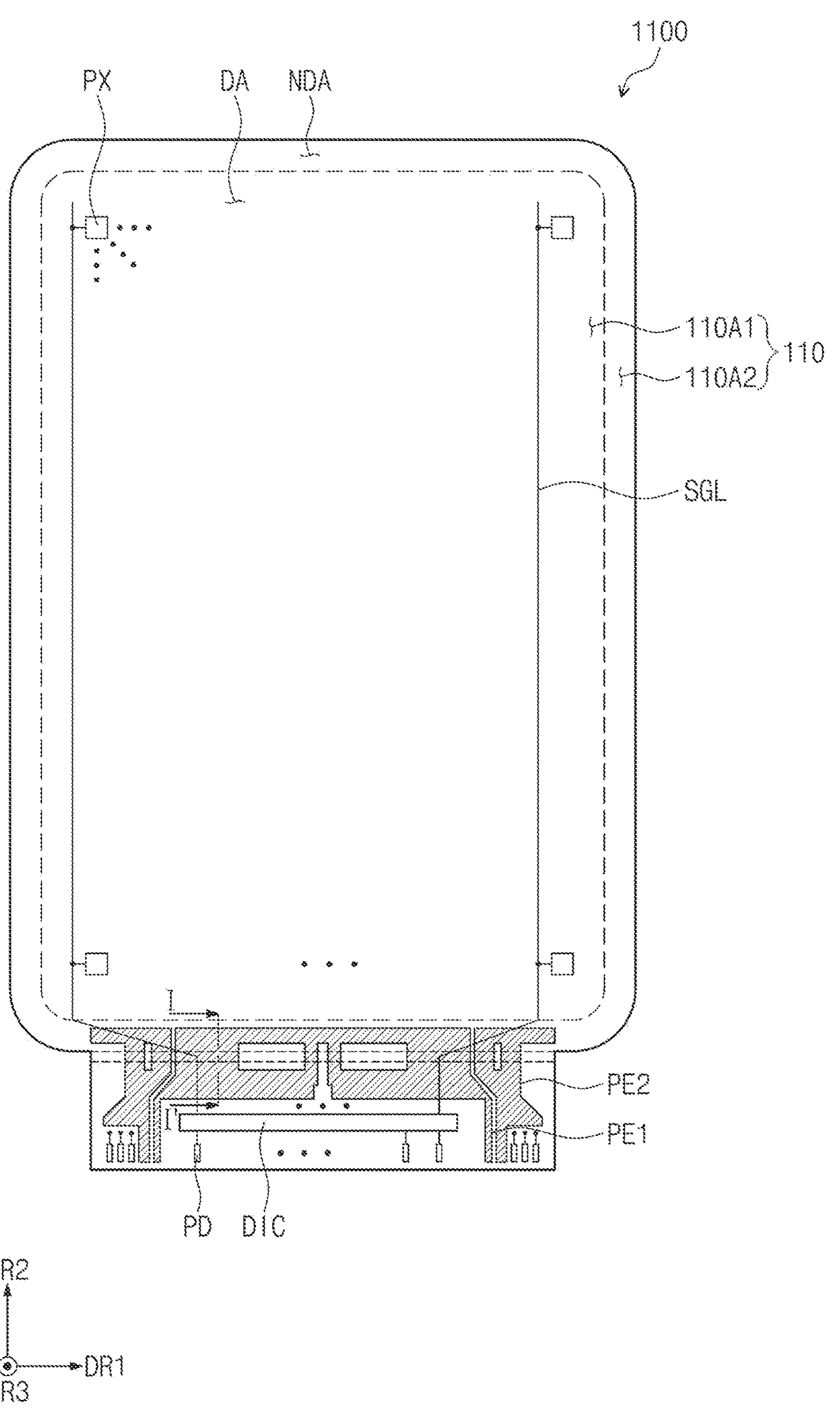
FIG. 3 is a plan view of a display panel according to some embodiments of the present disclosure.

FIG. 3 is a plan view of the display panel 1100 according to some embodiments of the present disclosure.

Referring to FIG. 3, the display panel 1100 may include a display area DA and a non-display area NDA. The display panel 1100 may include a base layer 110, a plurality of pixels PX located in the display area DA, a first power electrode PE1 located in the non-display area NDA, and a second power electrode PE2 located in the non-display area NDA.

In the base layer 110, a first area 110A1 and a second area 110A2 may be defined. The first area 110A1 of the base layer 110 may overlap the display area DA, and the second area 110A2 of the base layer 110 may overlap the non-display area NDA. That is, the first area 110A1 of the base layer 110 may be a base face on which components arranged in the display area DA are located, while the second area 110A2 of the base layer 110 may be a base face on which components arranged in the non-display area NDA are located.

The plurality of pixels PX may be located in the display area DA. The plurality of pixels PX may be located on the first area 110A1. A plurality of wirings SGL may be located on the base layer 110 and may be electrically connected to the pixels PX. In a plan view, the plurality of wirings SGL may extend from the first area 110A1 toward the second area 110A2.

The first power electrode PE1 may be located in the second area 110A2, and may provide a first drive voltage ELVDD (refer to FIG. 4) to the pixels PX. The first power electrode PE1 may be electrically connected to a first drive voltage line VL1 (refer to FIG. 4) to be described later. The first power electrode PE1 may provide the first drive voltage ELVDD to a pixel circuit PDC (refer to FIG. 4). The first power electrode PE1 may be referred to as a first conductive pattern or a first conductive portion.

The second power electrode PE2 may be located in the second area 110A2, and may provide a second drive voltage ELVSS (refer to FIG. 4) to the pixels PX. The second power electrode PE2 may be electrically connected to a second drive voltage line VL2 (refer to FIG. 4) to be described later. The second power electrode PE2 may provide the second drive voltage ELVSS to a light-emitting element ED (refer to FIG. 4). The second power electrode PE2 may be referred to as a second conductive pattern or a second conductive portion.

A driver chip DIC may be mounted in the display panel 1100. For example, the driver chip DIC may be mounted in an area overlapping the non-display area NDA and the second area 110A2. However, embodiments according to the present disclosure are not limited thereto. For example, the driver chip DIC may not be mounted in the display panel 1100.

A plurality of pads PD may be located in the non-display area NDA and the second area 110A2. The plurality of pads PD may receive a signal or a voltage required for the display panel 1100.

Figure 4:
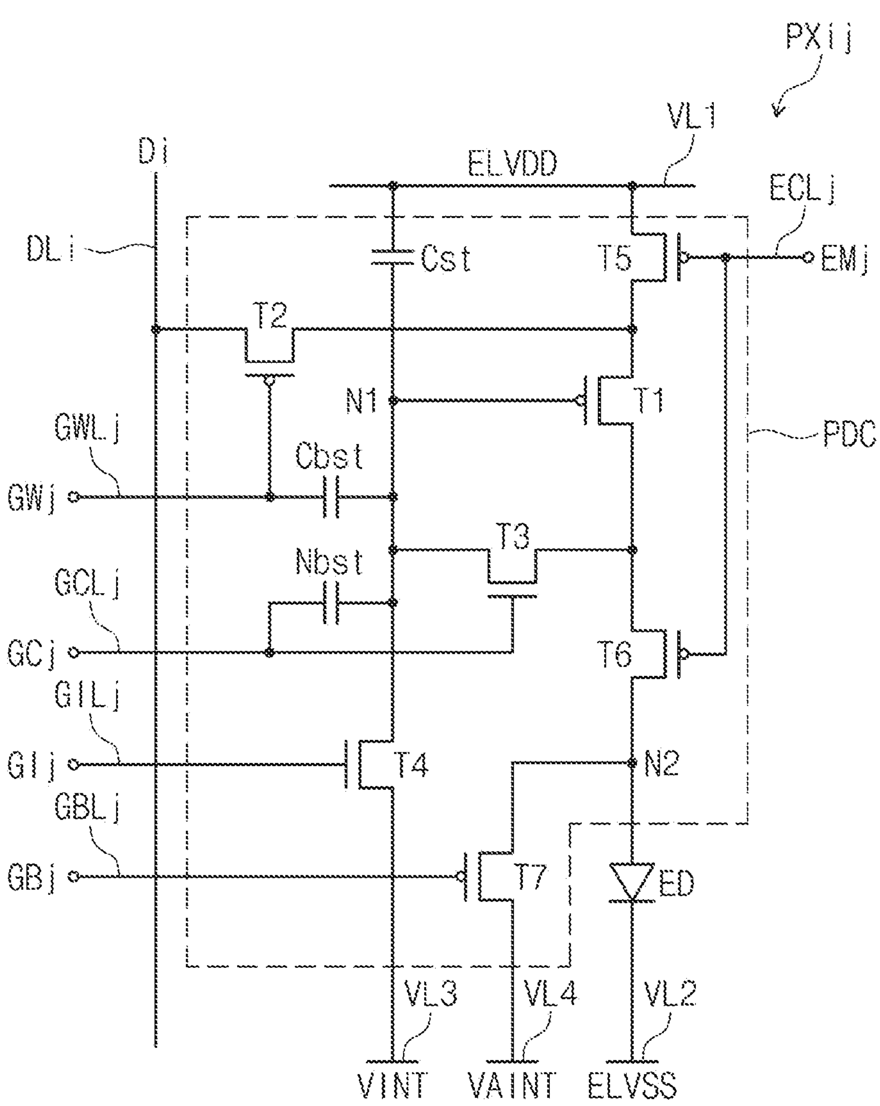
FIG. 4 is an equivalent circuit diagram of a pixel according to some embodiments of the present disclosure.

FIG. 4 is an equivalent circuit diagram of a pixel PXij according to some embodiments of the present disclosure.

Referring to FIG. 4, an equivalent circuit diagram of one pixel PXij among the plurality of pixels PX (refer to FIG. 3) is shown by way of example. Because the plurality of pixels PX have the same circuit structure, a detailed description of each of the remaining pixels PX is replaced with a description of a circuit structure of the pixel PXij.

Referring to FIG. 4, the pixel PXij may be connected to an i-th data line DLi, a j-th initialization scan line GILj, a j-th compensation scan line GCLj, a j-th write scan line GWLj, a j-th black scan line GBLj, a j-th light-emission control line ECLj, the first and second drive voltage lines VL1 and VL2, and first and second initialization voltage lines VL3 and VL4. In this regard, i is an integer greater than or equal to 1, and j is an integer greater than or equal to 1.

The pixel PXij includes the light-emitting element ED and the pixel circuit PDC. The light-emitting element ED may be a light-emitting diode. In one example of the present disclosure, the light-emitting element ED may be an organic light-emitting diode including an organic light-emitting layer. However, embodiments according to the present disclosure are not particularly limited thereto. The pixel circuit PDC may control an amount of current flowing in the light-emitting element ED in response to a i-th data signal Di. The light-emitting element ED may emit light at luminance (e.g., a set or predefined luminance) in response to the current amount provided from the pixel circuit PDC.

The pixel circuit PDC may include first to seventh transistors T1, T2, T3, T4, T5, T6, and T7, and the first to third capacitors Cst, Cbst, and Nbst. According to the present disclosure, a configuration of the pixel circuit PDC is not limited to the embodiments as shown and described with respect to FIG. 4. The pixel circuit PDC as shown in FIG. 4 is only an example, and the configuration of the pixel circuit PDC may be implemented in a modified manner. For example, some embodiments according to the present disclosure may include fewer components or additional components without departing from the spirit and scope of embodiments according to the present disclosure.

At least one of the first to seventh transistors T1, T2, T3, T4, T5, T6, or T7 may be a transistor having a low-temperature polycrystalline silicon (LTPS) semiconductor layer. At least one of the first to seventh transistors T1, T2, T3, T4, T5, T6, or T7 may have an oxide semiconductor layer. For example, the third and fourth transistors T3 and T4 may be oxide semiconductor transistors, and the first, second, fifth, sixth, and seventh transistors T1, T2, T5, T6, and T7 may be LTPS transistors.

Specifically, the first transistor T1 which directly affects brightness of the light-emitting element ED may be configured to include a semiconductor layer composed of highly reliable polycrystalline silicon, and thus, a high-resolution display device may be implemented. In one example, an oxide semiconductor has high carrier mobility and low leakage current. Thus, even when an operation time is large, a voltage drop is not large. That is, because a color change of an image due to a voltage drop is not large even during a low-frequency operation, a low-frequency operation may be realized. In this way, the oxide semiconductor has small leakage current. Thus, at least one of the third transistor T3 or fourth transistor T4 connected to a gate electrode of the first transistor T1 may include the oxide semiconductor, such that leakage current that may flow to the gate electrode of the first transistor T1 may be prevented and at the same time, power consumption may be reduced.

Each of some of the first to seventh transistors T1, T2, T3, T4, T5, T6, and T7 may be a P-type transistor, and each of the remaining ones may be an N-type transistor. For example, each of the first, second, fifth, sixth, and seventh transistors T1, T2, T5, T6, and T7 may be the P-type transistor, and each of the third and fourth transistors T3 and T4 may be the N-type transistor.

A configuration of the pixel circuit PDC according to the present disclosure is not limited to the embodiments as shown and described with respect to FIG. 4. The pixel circuit PDC as shown in FIG. 4 is only an example, and the configuration of the pixel circuit PDC may be implemented in a modified manner. For example, all of the first to seventh transistors T1, T2, T3, T4, T5, T6, and T7 may be P-type transistors or N-type transistors. Alternatively, each of the first, second, fifth, and sixth transistors T1, T2, T5, and T6 may be the P-type transistor, and each of the third, fourth, and seventh transistors T3, T4, and T7 may be the N-type transistor.

The j-th initialization scan line GILj, the j-th compensation scan line GCLj, the j-th write scan line GWLj, the j-th black scan line GBLj and the j-th light-emission control line ECLj may respectively transfer a j-th initialization scan signal GIj, a j-th compensation scan signal GCj, a j-th write scan signal GWj, a j-th black scan signal GBj and a j-th light-emission control signal EMj to the pixel PXij. The i-th data line DLi transfers the i-th data signal Di to the pixel PXij. The i-th data signal Di may have a voltage level corresponding to an image signal input to the display device 1000 (refer to FIG. 1).

The first and second drive voltage lines VL1 and VL2 may transfer the first drive voltage ELVDD and the second drive voltage ELVSS to the pixel PXij, respectively. Further, the first and second initialization voltage lines VL3 and VL4 may transfer a first initialization voltage VINT and a second initialization voltage VAINT to the pixel PXij, respectively.

The first transistor T1 is connected to and located between the first drive voltage line VL1 receiving the first drive voltage ELVDD and the light-emitting element ED. The first transistor T1 includes a first electrode connected to the first drive voltage line VL1 via the fifth transistor T5, a second electrode connected to a first electrode (also referred to as an anode) of the light-emitting element ED via the sixth transistor T6, and a third electrode (e.g., a gate electrode) connected to one end (e.g., a first node N1) of the first capacitor Cst. The first transistor T1 may receive the i-th data signal Di transmitted from the i-th data line DLi under a switching operation of the second transistor T2 to supply a drive current to the light-emitting element ED.

The second transistor T2 is connected to and located between the i-th data line DLi and the first electrode of the first transistor T1. The second transistor T2 includes a first electrode connected to the i-th data line DLi, a second electrode connected to the first electrode of the first transistor T1, and a third electrode (e.g., a gate electrode) connected to the j-th write scan line GWLj. The second transistor T2 may be turned on based on the j-th write scan signal GWj received from the j-th write scan line GWLj to transmit the i-th data signal Di delivered from the i-th data line DLi to the first electrode of the first transistor T1. One end of the second capacitor Cbst may be connected to the third electrode of the second transistor T2, and the other end of the second capacitor Cbst may be connected to the first node N1.

The third transistor T3 is connected to and located between the second electrode of the first transistor T1 and the first node N1. The third transistor T3 includes a first electrode connected to the third electrode of the first transistor T1, a second electrode connected to the second electrode of the first transistor T1, and a third electrode (e.g., a gate electrode) connected to the j-th compensation scan line GCLj. The third transistor T3 may be turned on based on the j-th compensation scan signal GCj received from the j-th compensation scan line GCLj to connect the third electrode of the first transistor T1 and the second electrode of the first transistor T1 to each other such that the first transistor T1 may be conductive in a diode manner. One end of the third capacitor Nbst may be connected to the third electrode of the third transistor T3, and the other end of the third capacitor Nbst may be connected to the first node N1.

The fourth transistor T4 is connected to and located between the first node N1 and the first initialization voltage line VL3 to which the first initialization voltage VINT is applied. The fourth transistor T4 includes a first electrode connected to the first initialization voltage line VL3 to which the first initialization voltage VINT is delivered, a second electrode connected to the first node N1, and a third electrode (e.g., a gate electrode) connected to the j-th initialization scan line GILj. The fourth transistor T4 may be turned on based on the j-th initialization scan signal GIj received from the j-th initialization scan line GILj. The turned-on fourth transistor T4 may transfer the first initialization voltage VINT to the first node N1 to initialize a potential (that is, a potential of the first node N1) of the third electrode of the first transistor T1.

The fifth transistor T5 includes a first electrode connected to the first drive voltage line VL1, a second electrode connected to the first electrode of the first transistor T1, and a third electrode (e.g., a gate electrode) connected to the j-th light-emission control line ECLj. The sixth transistor T6 includes a first electrode connected to the second electrode of the first transistor T1, a second electrode connected to the first electrode (e.g., a second node N2) of the light-emitting element ED, and the third electrode (e.g., a gate electrode) connected to the j-th light-emission control line ECLj.

The fifth and sixth transistors T5 and T6 are simultaneously turned on based on the j-th light-emission control signal EMj transmitted from the j-th light-emission control line ECLj. The first drive voltage ELVDD applied via the turned-on fifth transistor T5 may be compensated via the first transistor T1 conductive in the diode manner, and then may be transmitted to the light-emitting element ED via the sixth transistor T6.

The seventh transistor T7 includes a first electrode connected to the second initialization voltage line VL4 to which the second initialization voltage VAINT is transmitted, a second electrode connected to the second electrode of the sixth transistor T6, and a third electrode (e.g., a gate electrode) connected to the j-th black scan line GBLj. The second initialization voltage VAINT may have a voltage level lower than or equal to the first initialization voltage VINT.

One end of the first capacitor Cst is connected to the third electrode of the first transistor T1, and the other end of the first capacitor Cst is connected to the first drive voltage line VL1. A cathode of the light-emitting element ED may be connected to the second drive voltage line VL2 delivering the second drive voltage ELVSS. The second drive voltage ELVSS may have a lower voltage level than the first drive voltage ELVDD.

Figure 5:
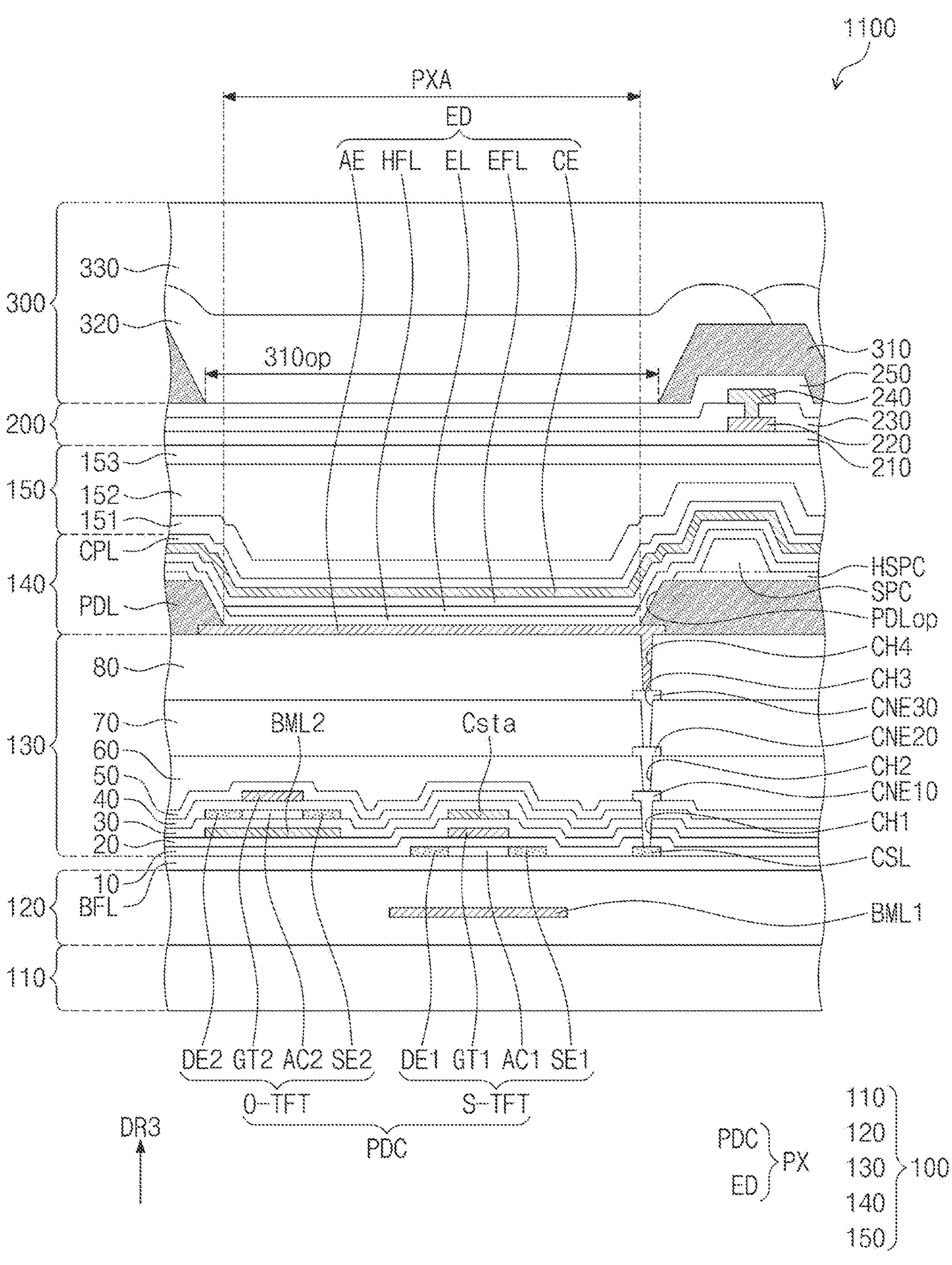
FIG. 5 is an enlarged cross-sectional view illustrating a partial area of a display panel according to some embodiments of the present disclosure.

FIG. 5 is an enlarged cross-sectional view illustrating a partial area of the display panel 1100 according to some embodiments of the present disclosure.

Referring to FIG. 5, the display panel 1100 may include a display layer 100, a sensor layer 200, and an anti-reflective layer 300. The display layer 100 may include the base layer 110, a barrier layer 120, a circuit layer 130, an element layer 140, and an encapsulation layer 150.

The base layer 110 may have a single-layer or multi-layer structure. For example, the base layer 110 may include at least one of polyimide-based resin, acrylate-based resin, methacrylate-based resin, polyisoprene-based resin, vinyl-based resin, epoxy-based resin, urethane-based resin, cellulose-based resin, siloxane-based resin, polyamide-based resin, perylene-based resin, silicon oxide, silicon nitride, silicon oxynitride, or amorphous silicon. As used herein, "~based resin" means including a functional group of "~".

The barrier layer 120 may be located on the base layer 110. The barrier layer 120 may have a single-layer or multi-layer structure. The barrier layer 120 may include at least one of silicon oxide, silicon nitride, silicon oxynitride, or amorphous silicon.

The barrier layer 120 may further include a first lower light-blocking layer BML1. For example, when the barrier layer 120 has a multi-layer structure, the first lower light-blocking layer BML1 may be located between layers constituting the barrier layer 120. However, embodiments according to the present disclosure are not limited thereto, and the first lower light-blocking layer BML1 may be located between the base layer 110 and the barrier layer 120 or may be located on the barrier layer 120. According to some embodiments, the first lower light-blocking layer BML1 may be omitted. The first lower light-blocking layer BML1 may be referred to as a first lower layer, a first lower metal layer, a first lower electrode layer, a first lower shielding layer, a first light-blocking layer, a first metal layer, a first shielding layer, or a first overlap layer.

The buffer layer BFL may be located on the barrier layer 120. The buffer layer BFL may prevent diffusion of metal atoms or impurities from the base layer 110 to a first semiconductor pattern. Further, the buffer layer BFL may adjust a heat supply rate during a crystallization process to form the first semiconductor pattern so that the first semiconductor pattern is uniformly formed.

The buffer layer BFL may include a plurality of inorganic layers. For example, the buffer layer BFL may include a first sub-buffer layer including silicon nitride, and a second sub-buffer layer located on the first sub-buffer layer and including silicon oxide.

The circuit layer 130 may be located on the buffer layer BFL, and the element layer 140 may be located on the circuit layer 130. The pixel PX may include the pixel circuit PDC and the light-emitting element ED electrically connected to the pixel circuit PDC. The pixel circuit PDC may be included in the circuit layer 130, and the light-emitting element ED may be included in the element layer 140.

FIG. 5 shows a silicon thin-film transistor S-TFT and an oxide thin-film transistor O-TFT of the pixel circuit PDC by way of example. The silicon thin-film transistor S-TFT may act as one of the first, second, fifth, sixth, and seventh transistors T1, T2, T5, T6, and T7 as described in FIG. 4, while the oxide thin-film transistor O-TFT may act as one of the third and fourth transistors T3 and T4.

The first semiconductor pattern may be located on the buffer layer BFL. The first semiconductor pattern may include silicon semiconductor. For example, silicon semiconductor may include amorphous silicon, polycrystalline silicon, and the like. For example, the first semiconductor pattern may include low-temperature polysilicon.

FIG. 5 only shows a portion of the first semiconductor pattern located on the buffer layer BFL, and the first semiconductor pattern may be further located in another area. The first semiconductor patterns may be arranged across the pixels according to a specific rule. The first semiconductor pattern may have different electrical properties depending on whether the first semiconductor pattern is doped or not. The first semiconductor pattern may include a first area with high conductivity and a second area with low conductivity. The first area may be doped with an N-type dopant or a P-type dopant. A P-type transistor may include a doped area doped with a P-type dopant, and an N-type transistor may include a doped area doped with an N-type dopant. The second area may be a non-doped area or an area doped with a dopant at a lower concentration than a concentration at which the first area is doped.

The conductivity of the first area may be greater than that of the second area, and the first area may actually serve as an electrode or a signal line. The second area may substantially correspond to an active area (or a channel) of a transistor. In other words, a portion of the first semiconductor pattern may be an active area of a transistor, another portion thereof may be a source or a drain of the transistor, and still another portion thereof may be a connection electrode or a connection signal line.

A source area SE1, an active area AC1, and a drain area DE1 of the silicon thin-film transistor S-TFT may be formed from the first semiconductor pattern. The source area SE1 and the drain area DE1 may extend in opposite directions to each other from the active area AC1 in a cross-sectional view.

FIG. 5 shows a portion of a connection signal line CSL formed from the first semiconductor pattern. The connection signal line CSL may be electrically connected to the second electrode of the sixth transistor T6 (refer to FIG. 4).

The circuit layer 130 may include a plurality of inorganic layers and a plurality of organic layers. According to some embodiments, each of first to fifth insulating layers 10, 20, 30, 40, and 50 sequentially stacked on the buffer layer BFL may be an inorganic layer, and each of sixth to eighth insulating layers 60, 70, and 80 sequentially stacked thereon may be an organic layer.

The first insulating layer 10 may be located on the buffer layer BFL. The first insulating layer 10 may cover the first semiconductor pattern. The first insulating layer 10 may be an inorganic layer and/or an organic layer, and may have a single-layer or multi-layer structure. The first insulating layer 10 may include at least one of aluminum oxide, titanium oxide, silicon oxide, silicon nitride, silicon oxynitride, zirconium oxide, or hafnium oxide. According to some embodiments, the first insulating layer 10 may be a single layer made of silicon oxide. An insulating layer of the circuit layer 130 to be described later in addition to the first insulating layer 10 may have a single-layer or multi-layer structure.

A gate electrode GT1 of the silicon thin-film transistor S-TFT is located on the first insulating layer 10. The gate electrode GT1 may be a portion of a metal pattern. The gate electrode GT1 overlaps the active area AC1. In a process of doping the first semiconductor pattern with the dopant, the gate electrode GT1 may function as a mask. The gate electrode GT1 may include titanium, silver, alloy containing silver, molybdenum, alloy containing molybdenum, aluminum, alloy containing aluminum, aluminum nitride, tungsten, tungsten nitride, copper, indium tin oxide, or indium Zinc oxide, etc. However, embodiments according to the present disclosure are not particularly limited thereto.

The second insulating layer 20 may be located on the first insulating layer 10 and may cover the gate electrode GT1. The second insulating layer 20 may be an inorganic layer and may have a single-layer or multi-layer structure. The second insulating layer 20 may include at least one of silicon oxide, silicon nitride, or silicon oxynitride. According to some embodiments, the second insulating layer 20 may have a single-layer structure made of silicon nitride.

The third insulating layer 30 may be located on the second insulating layer 20. The third insulating layer 30 may be an inorganic layer and may have a single-layer or multi-layer structure. For example, the third insulating layer 30 may have a multi-layer structure including a silicon oxide layer and a silicon nitride layer. One electrode Csta of the first capacitor Cst (refer to FIG. 4) may be located between the second insulating layer 20 and the third insulating layer 30. Further, the other electrode of the first capacitor Cst may be located between the first insulating layer 10 and the second insulating layer 20.

A second semiconductor pattern may be located on the third insulating layer 30. The second semiconductor pattern may include oxide semiconductor. The oxide semiconductor may include a plurality of areas distinguished from each other based on whether or not a metal oxide has been reduced. An area (hereinafter, referred to as a reduced area) where the metal oxide has been reduced has higher conductivity than that of an area (hereinafter, referred to as a non-reduced area) where the metal oxide has not been reduced. The reduced area may act actually as a source or a drain of a transistor or a signal line. The non-reduced area substantially corresponds to an active area (or a semiconductor area or a channel) of the transistor. In other words, a portion of the second semiconductor pattern may be an active area of a transistor, another portion thereof may be a source/drain area of a transistor, and still another portion thereof may be a signal transfer area.

A source area SE2, an active area AC2, and a drain area DE2 of the oxide thin-film transistor O-TFT may be formed from the second semiconductor pattern. The source area SE2 and the drain area DE2 may extend in opposite directions to each other from the active area AC2 in a cross-sectional view.

The fourth insulating layer 40 may be located on the third insulating layer 30. The fourth insulating layer 40 may cover the second semiconductor pattern. The fourth insulating layer 40 may be an inorganic layer and may have a single-layer or multi-layer structure. The fourth insulating layer 40 may include at least one of aluminum oxide, titanium oxide, silicon oxide, silicon nitride, silicon oxynitride, zirconium oxide, or hafnium oxide. According to some embodiments, the fourth insulating layer 40 may have a single-layer structure including silicon oxide.

A gate electrode GT2 of the oxide thin-film transistor O-TFT is located on the fourth insulating layer 40. The gate electrode GT2 may be a portion of a metal pattern. The gate electrode GT2 overlaps the active area AC2. In a process of reducing the second semiconductor pattern, the gate electrode GT2 may function as a mask.

A second lower light-blocking layer BML2 may be located under the oxide thin-film transistor O-TFT. The second lower light-blocking layer BML2 may be located between the second insulating layer 20 and the third insulating layer 30. The second lower light-blocking layer BML2 may include the same material as that of one electrode Csta of the first capacitor Cst (refer to FIG. 4). The second lower light-blocking layer BML2 and one electrode Csta of the first capacitor Cst (refer to FIG. 4) may be formed via the same process.

The fifth insulating layer 50 may be located on the fourth insulating layer 40 and may cover the gate electrode GT2. The fifth insulating layer 50 may be an inorganic layer and/or an organic layer, and may have a single-layer or multi-layer structure. For example, the fifth insulating layer 50 may have a multi-layer structure including a silicon oxide layer and a silicon nitride layer.

A first connection electrode CNE10 may be located on the fifth insulating layer 50. The first connection electrode CNE10 may be connected to the connection signal line CSL via a first contact hole CH1 extending through the first to fifth insulating layers 10, 20, 30, 40, and 50.

The sixth insulating layer 60 may be located on the fifth insulating layer 50. A second connection electrode CNE20 may be located on the sixth insulating layer 60. The second connection electrode CNE20 may be connected to the first connection electrode CNE10 via a second contact hole CH2 extending through the sixth insulating layer 60.

The seventh insulating layer 70 may be located on the sixth insulating layer 60 and may cover the second connection electrode CNE20.

A third connection electrode CNE30 may be located on the seventh insulating layer 70. The third connection electrode CNE30 may be connected to the second connection electrode CNE20 via a third contact hole CH3 extending through the seventh insulating layer 70.

The eighth insulating layer 80 may be located on the seventh insulating layer 70 and may cover the third connection electrode CNE30.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include a general-purpose polymer such as BCB (Benzocyclobutene), polyimide, HMDSO (Hexamethyldisiloxane), Polymethylmethacrylate (PMMA), or polystyrene (PS), a polymer derivative having a phenolic group, an acrylate-based polymer, an imide-based polymer, an arylether-based polymer, an amide-based polymer, a fluorine-based polymer, a p-xylene-based polymer, a vinyl alcohol-based polymer, or blends thereof.

The light-emitting element ED may include a first electrode AE, a first function layer HFL, a light-emitting layer EL, a second function layer EFL, and a second electrode CE. The first function layer HFL, the second function layer EFL, and the second electrode CE may commonly belong to the pixels PX (refer to FIG. 3). The first function layer HFL, the light-emitting layer EL, and the second function layer EFL may be referred to as intermediate layers. The first electrode AE may be referred to as a pixel electrode or an anode, and the second electrode CE may be referred to as a common electrode or a cathode.

The first electrode AE may be located on the eighth insulating layer 80. The first electrode AE may be connected to the third connection electrode CNE30 electrically connected to the pixel circuit PDC via a fourth contact hole CH4 extending through the eighth insulating layer 80.

The first electrode AE may be a transmissive (or transflective) electrode or a reflective electrode. According to some embodiments, the first electrode AE may include a reflective layer made of silver, magnesium, aluminum, platinum, palladium, gold, nickel, neodymium, iridium, chromium, or a compound thereof, and a transmissive or transflective electrode layer formed on the reflective layer. The transmissive or transflective electrode layer may include at least one selected from a group consisting of indium tin oxide, indium zinc oxide, indium gallium zinc oxide, zinc oxide or indium oxide, and aluminum doped zinc oxide. For example, the first electrode AE may include a multi-layer structure in which layers respectively made of indium tin oxide, silver, and indium tin oxide are sequentially stacked.

A pixel defining film PDL may be located on the eighth insulating layer 80. The pixel defining film PDL may have a property of absorbing light. For example, the pixel defining film PDL may have a black color. The pixel defining film PDL may include a black coloring agent. The black coloring agent may include black dyes and black pigments. The black coloring agent may include carbon black, a metal such as chromium, or an oxide thereof.

An opening PDLop exposing a portion of the first electrode AE may be defined in the pixel defining film PDL. That is, the pixel defining film PDL may cover an edge of the first electrode AE. A light-emitting area PXA may be defined by the pixel defining film PDL.

A spacer HSPC may be located on the pixel defining film PDL. A protruding spacer SPC may be located on the spacer HSPC. The spacer HSPC and the protruding spacer SPC may have an integral structure and may be made of the same material. For example, the spacer HSPC and the protruding spacer SPC may be formed via the same process by means of a halftone mask. However, this is only an example. Embodiments according to the present disclosure are not limited thereto. For example, the spacer HSPC and the protruding spacer SPC may include different materials and may be respectively formed via separate processes.

The first function layer HFL may be located on the first electrode AE, the pixel defining film PDL, the spacer HSPC, and the protruding spacer SPC. The first function layer HFL may include a hole transport layer (HTL), a hole injection layer (HIL), or both a hole transport layer and a hole injection layer. The first function layer HFL may be arranged across an entirety of the display area DA (refer to FIG. 3).

The light-emitting layer EL may be located on the first function layer HFL and may be located in an area corresponding to the opening PDLop of the pixel defining film PDL. The light-emitting layer EL may include an organic material, an inorganic material, or an organic-inorganic material that may emit colored light (e.g., of a set or predefined color).

The second function layer EFL may be located on the first function layer HFL and may cover the light-emitting layer EL. The second function layer EFL may include an electron transport layer (ETL), an electron injection layer (EIL), or both an electron transport layer and an electron injection layer. The second function layer EFL may be arranged across an entirety of the display area DA (refer to FIG. 3).

The second electrode CE may be located on the second function layer EFL. The second electrode CE may be located in the display area DA (refer to FIG. 3).

The element layer 140 may further include a capping layer CPL located on the second electrode CE. The capping layer CPL may play a role in improving light-emitting efficiency under a principle of constructive interference. The capping layer CPL may include, for example, a material with a refractive index of 1.6 or higher relative to light with a wavelength of 589 nm. The capping layer CPL may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, porphine derivatives, phthalocyanine derivatives, naphthalocyanine derivatives, an alkali metal complex, an alkaline earth metal complex, or any combinations thereof. Each of the carbocyclic compound, the heterocyclic compound, and the amine group-containing compound may be optionally substituted with a substituent including O, N, S, Se, Si, F, Cl, Br, I, or any combination thereof.

The encapsulation layer 150 may be located on the element layer 140. Referring to FIG. 5 together with FIG. 3, the encapsulation layer 150 may cover the pixels PX, a portion of the first power electrode PE1, and a portion of the second power electrode PE2, and may be located on the first area 110A1 and the second area 110A2.

The encapsulation layer 150 may include a first inorganic encapsulation layer 151, an organic encapsulation layer 152, and a second inorganic encapsulation layer 153 sequentially stacked. The first and second inorganic encapsulation layers 151 and 153 may protect the element layer 140 from moisture and oxygen, and the organic encapsulation layer 152 may protect the element layer 140 from foreign materials such as dust particles.

According to some embodiments of the present disclosure, a low refractive index layer may be further located between the capping layer CPL and the encapsulation layer 150. The low refractive index layer may include lithium fluoride. The low refractive index layer may be formed by thermal evaporation.

The sensor layer 200 may be located on the display layer 100. The sensor layer 200 may be referred to as a sensor, an input detection layer, or an input detection panel. The sensor layer 200 may include a sensor base layer 210, a first sensor conductive layer 220, a sensor insulating layer 230, a second sensor conductive layer 240, and a sensor cover layer 250.

The sensor base layer 210 may be directly located on the display layer 100. The sensor base layer 210 may be an inorganic layer including at least one of silicon nitride, silicon oxynitride, or silicon oxide. Alternatively, the sensor base layer 210 may be an organic layer including an epoxy-based resin, an acrylate-based resin, or an imide-based resin. The sensor base layer 210 may have a single-layer structure or a multi-layer structure in which layers are stacked along the third direction DR3.

Each of the first sensor conductive layer 220 and the second sensor conductive layer 240 may have a single-layer structure or may have a multi-layer structure in which layers are stacked along the third direction DR3.

The conductive layer having a single-layer structure may include a metal layer or a transparent conductive layer. The metal layer may include molybdenum, silver, titanium, copper, aluminum, or an alloy thereof. The transparent conductive layer may include a transparent conductive oxide such as indium tin oxide, indium zinc oxide, zinc oxide, or indium zinc tin oxide. Alternatively, the transparent conductive layer may include a conductive polymer such as PEDOT, a metal nanowire, graphene, and the like.

The conductive layer having a multilayer structure may include metal layers. The metal layers may include, for example, a titanium layer/an aluminum layer/a titanium layer. The conductive layer having a multilayer structure may include at least one metal layer and at least one transparent conductive layer.

The sensor insulating layer 230 may be located between the first sensor conductive layer 220 and the second sensor conductive layer 240. The sensor insulating layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensor insulating layer 230 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

The sensor cover layer 250 may be located on the sensor insulating layer 230 and may cover the second sensor conductive layer 240. The second sensor conductive layer 240 may include a conductive pattern. The sensor cover layer 250 may cover the conductive pattern and may reduce or eliminate a probability of damage to the conductive pattern in a subsequent process. The sensor cover layer 250 may include an inorganic material. For example, the sensor cover layer 250 may include silicon nitride. However, embodiments according to the present disclosure are not particularly limited thereto. According to some embodiments of the present disclosure, the sensor cover layer 250 may be omitted.

The anti-reflective layer 300 may be located on the sensor layer 200. The anti-reflective layer 300 may include a division layer 310, a plurality of color filters 320, and a planarization layer 330.

The division layer 310 may overlap with the conductive pattern of the second sensor conductive layer 240. The sensor cover layer 250 may be located between the division layer 310 and the second sensor conductive layer 240. The division layer 310 may prevent reflection of external light from the second sensor conductive layer 240. A material constituting the division layer 310 is not particularly limited as long as the material can absorbs light. The division layer

310 may be a layer having a black color. According to some embodiments, the division layer 310 may include a black coloring agent. The black coloring agent may include black dyes and black pigments. The black coloring agent may include carbon black, a metal such as chromium, or an oxide thereof.

A division opening 310*op* may be defined in the division layer 310. The division opening 310*op* may overlap with the light-emitting layer EL. The color filter 320 may be located in an area corresponding to the division opening 310*op*. The color filter 320 may transmit therethrough light provided from the light-emitting layer EL overlapping the color filter 320.

The planarization layer 330 may cover the division layer 310 and the color filter 320. The planarization layer 330 may include an organic material. An upper surface of the planarization layer 330 may be flat. According to some embodiments, the planarization layer 330 may be omitted.

According to some embodiments of the present disclosure, the anti-reflective layer 300 may include a reflection adjustment layer instead of the color filter 320. For example, in the illustration of FIG. 5, the color filter 320 may be omitted, and the reflection adjustment layer may be added to an area in which the color filter 320 is omitted. The reflection adjustment layer may selectively absorb a portion of light reflected from an inside of the display panel and/or an electronic device or light incident thereto from an outside out of the display panel and/or the electronic device.

In one example, the reflection adjustment layer may absorb light in a first wavelength range of 490 nm to 505 nm and a second wavelength range of 585 nm to 600 nm, and thus may have transmittance of 40% or lower of light in the first wavelength range and the second wavelength range. The reflection adjustment layer may absorb light of a wavelength out of a wavelength range of red, green, and blue light beams emitted from the light-emitting layer EL. In this way, the reflection adjustment layer may absorb light of a wavelength that does not belong to a wavelength range of the red, green, or blue light beam emitted from the light-emitting layer EL, thereby preventing or minimizing decrease in luminance of the display panel and/or the electronic device. Further, at the same time, degradation of light-emitting efficiency of the display panel and/or the electronic device may be prevented or minimized, and visibility may be improved.

The reflection adjustment layer may be embodied as an organic material layer including dyes, pigments, or combinations thereof. The reflection adjustment layer may include tetraazaporphyrin (TAP)-based compound, porphyrin-based compound, metal porphyrin-based compound, oxazine-based compound, squarylium-based compound, triarylmethane-based compound, polymethine-based compound, anthraquinone-based compound, phthalocyanine-based compound, azo-based compound, perylene-based compound, xanthene-based compound, diimmonium-based compound, dipyrromethene-based compound, cyanine-based compound, or combinations thereof.

According to some embodiments, the reflection adjustment layer may have a transmittance of about 64% to 72%. The transmittance of the reflection adjustment layer may be adjusted according to a content of the pigment and/or the dye included in the reflection adjustment layer.

According to some embodiments of the present disclosure, the anti-reflective layer 300 may include a phase retarder and/or a polarizer. The anti-reflective layer 300 may include at least a polarization film. In this case, the anti-reflective layer 300 may be attached to the sensor layer 200 via an adhesive layer.

Figure 6:
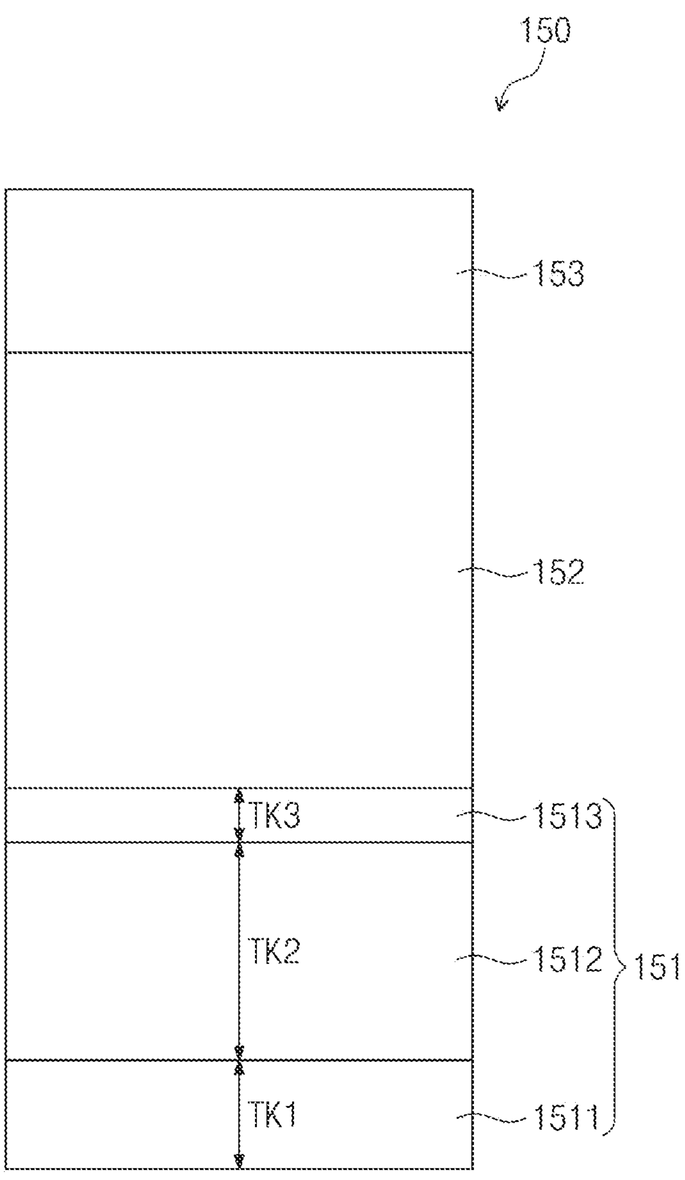
FIG. 6 is a schematic cross-sectional view of an encapsulation layer according to some embodiments of the present disclosure.

FIG. 6 is a schematic cross-sectional view of the encapsulation layer 150 according to some embodiments of the present disclosure.

Referring to FIG. 6, the encapsulation layer 150 may include the first inorganic encapsulation layer 151, the organic encapsulation layer 152, and the second inorganic encapsulation layer 153.

The first inorganic encapsulation layer 151 may include a plurality of sub-inorganic encapsulation layers 1511, 1512, and 1513 having different refractive indices. The plurality of sub-inorganic encapsulation layers 1511, 1512, and 1513 may include the first sub-inorganic encapsulation layer 1511, the second sub-inorganic encapsulation layer 1512, and the third sub-inorganic encapsulation layer 1513.

The first sub-inorganic encapsulation layer 1511 may have a first refractive index. The second sub-inorganic encapsulation layer 1512 has a second refractive index different from the first refractive index and may be located on the first sub-inorganic encapsulation layer 1511. The third sub-inorganic encapsulation layer 1513 has a third refractive index different from the first and second refractive indices and may be located on the second sub-inorganic encapsulation layer 1512. For example, the first refractive index may be lower than each of the second refractive index and the third refractive index, and the third refractive index may be lower than the second refractive index.

The first sub-inorganic encapsulation layer 1511 may have a refractive index of 1.7 or lower. For example, the first refractive index of the first sub-inorganic encapsulation layer 1511 may be in a range of 1.48 to 1.57. However, embodiments according to the present disclosure are not particularly limited thereto. The first sub-inorganic encapsulation layer 1511 may include silicon oxynitride. The first sub-inorganic encapsulation layer 1511 may be an optical layer that increases light emission efficiency.

The second sub-inorganic encapsulation layer 1512 among the first to third sub-inorganic encapsulation layers 1511, 1512, and 1513 may have the highest refractive index. For example, the second refractive index of the second sub-inorganic encapsulation layer 1512 may be 1.89. However, embodiments according to the present disclosure are not particularly limited thereto. The second sub-inorganic encapsulation layer 1512 may include silicon nitride. The second sub-inorganic encapsulation layer 1512 may serve to increase a difference between the refractive indices of the first to third sub-inorganic encapsulation layers 1511, 1512, and 1513. Further, the second sub-inorganic encapsulation layer 1512 may function as a barrier layer. For example, the second sub-inorganic encapsulation layer 1512 may function to prevent permeation of oxygen or moisture.

The third refractive index of the third sub-inorganic encapsulation layer 1513 may be 1.70. However, embodiments according to the present disclosure are not particularly limited thereto. The third sub-inorganic encapsulation layer 1513 may include silicon oxy nitride. The third sub-inorganic encapsulation layer 1513 may be a layer that adjusts optical dispersion.

According to some embodiments of the present disclosure, the first inorganic encapsulation layer 151 may have a multi-layer structure in which a layer of a low refractive index, a layer of a high refractive index, and a layer of a low refractive index are stacked. As the encapsulation layer 150 has a strong resonance structure, light emission efficiency at which the light is emitted from the light-emitting layer EL (refer to FIG. 5) may be improved, and thus power consumption of the display device 1000 (refer to FIG. 1) may be reduced. Further, because light extraction efficiency is improved, a lifetime of the display device 1000 (refer to FIG. 1) at a room temperature may be improved.

According to some embodiments of the present disclosure, a content ratio of Si, O, and N in the first sub-inorganic encapsulation layer 1511 may be Si: 40% to 42%, O: 48% to 51%, and N: 12% or smaller. In this regard, % may be atom %. A content ratio of Si, O, and N in the second sub-inorganic encapsulation layer 1512 may be Si: 63% to 65%, O: 3% or smaller, and N: 30% to 32%. In this regard, % may be atom %. A content ratio of Si, O, and N in the third sub-inorganic encapsulation layer 1513 may be Si: 53% to 56%, O: 15% to 16%, and N: 26% to 27%. In this regard, % may be atom %.

Based on the content ratio of each of the first to third sub-inorganic encapsulation layers 1511, 1512, and 1513, the lower the refractive index, the higher the oxygen content. Accordingly, the first sub-inorganic encapsulation layer 1511 may be formed via chemical vapor deposition in an environment with a relatively higher oxygen content than that of each of the second sub-inorganic encapsulation layer 1512 and the third sub-inorganic encapsulation layer 1513.

A thickness TK1 of the first sub-inorganic encapsulation layer 1511 may be smaller than a thickness TK2 of the second sub-inorganic encapsulation layer 1512 and may be greater than a thickness TK3 of the third sub-inorganic encapsulation layer 1513. For example, the thickness TK1 of the first sub-inorganic encapsulation layer 1511 may be in a range of about 1100 angstroms to about 1400 angstroms, the thickness TK2 of the second sub-inorganic encapsulation layer 1512 may be about 9000 angstroms, and the thickness TK3 of the third sub-inorganic encapsulation layer 1513 may be about 650 angstroms. However, the thickness of each layer is not necessarily limited to the above-described example.

The organic encapsulation layer 152 may be located on the first inorganic encapsulation layer 151. The organic encapsulation layer 152 may include a monomer, and may act to planarize steps resulting from the underlying layers, and to cover a particle. The organic encapsulation layer 152 may have a thickness of several micrometers. For example, the thickness may be 8.8 micrometers. However, embodiments according to the present disclosure are not particularly limited thereto. The organic encapsulation layer 152 may be formed using flash-evaporation or an inkjet process.

The second inorganic encapsulation layer 153 may be located on the organic encapsulation layer 152. A refractive index of the second inorganic encapsulation layer 153 may be substantially the same as that of the second sub-inorganic encapsulation layer 1512. For example, the refractive index of the second inorganic encapsulation layer 153 may be 1.89. A thickness of the second inorganic encapsulation layer 153 may be about 5000 angstroms, and the second inorganic encapsulation layer 153 may include silicon nitride. However, embodiments according to the present disclosure are not particularly limited thereto.

Figure 7:
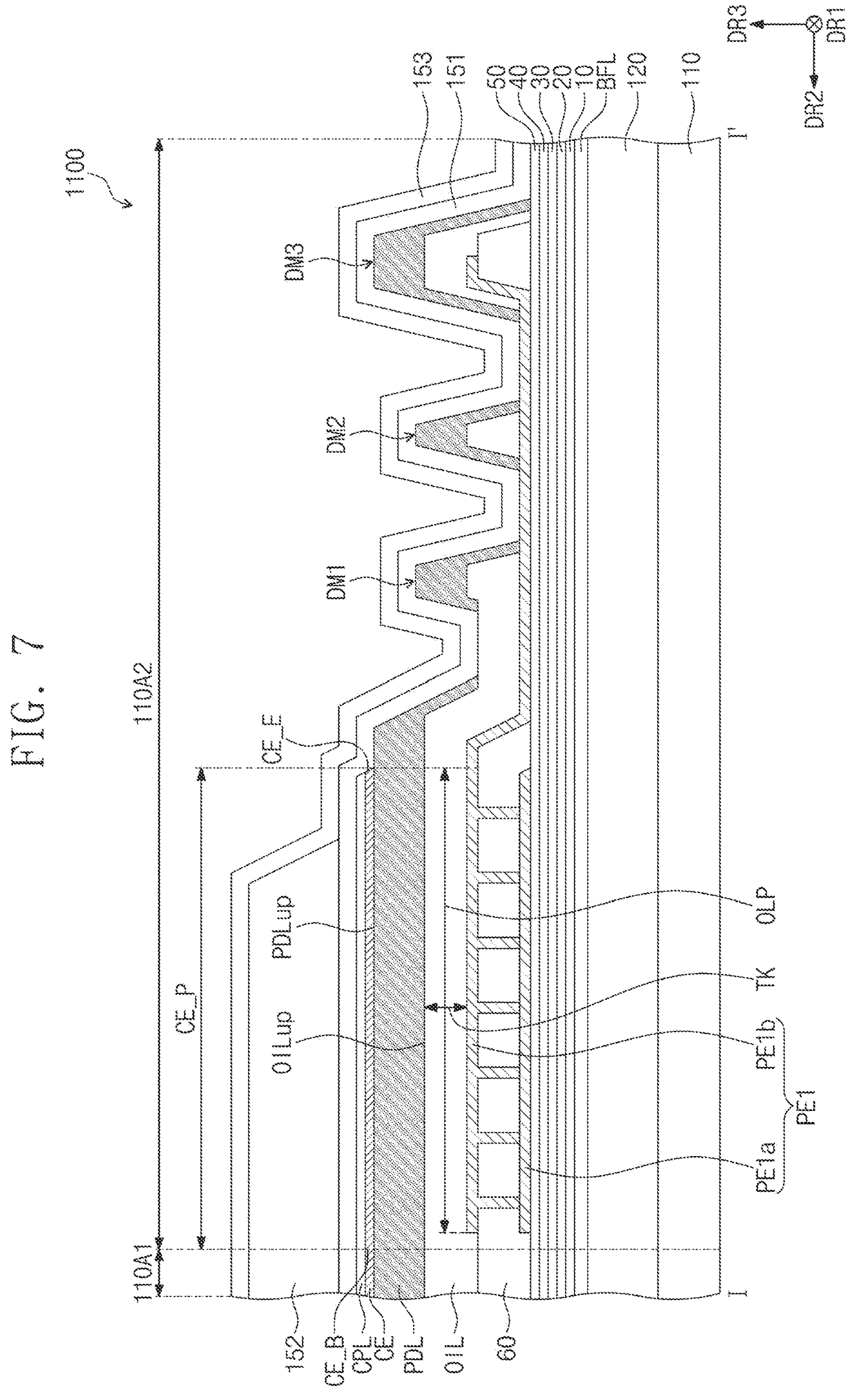
FIG. 7 is a cross-sectional view of a display panel according to some embodiments of the present disclosure.

FIG. 7 is a cross-sectional view of the display panel 1100 according to some embodiments of the present disclosure. FIG. 7 is a cross-sectional view showing a configuration of a portion of the display panel 1100 according to some embodiments of the present disclosure as taken along a line I-I' of FIG. 3.

Referring to FIG. 5 and FIG. 7, the first power electrode PE1 may include a first electrode layer PE1*a* and a second electrode layer PE1*b*. The first electrode layer PE1*a* may be located between the fifth insulating layer 50 and the sixth insulating layer 60. The second electrode layer PE1*b* may be located on the sixth insulating layer 60. The first electrode layer PE1*a* and the second electrode layer PE1*b* may be electrically connected to each other.

An insulating layer OIL may be located on the second electrode layer PE1*b*. The insulating layer OIL may include an organic material. For example, the insulating layer OIL may include a general-purpose polymer such as BCB (Benzocyclobutene), polyimide, HMDSO (Hexamethyldisiloxane), Polymethylmethacrylate (PMMA), or polystyrene (PS), a polymer derivative having a phenolic group, an acrylate-based polymer, an imide-based polymer, an arylether-based polymer, an amide-based polymer, a fluorine-based polymer, a p-xylene-based polymer, a vinyl alcohol-based polymer, or blends thereof.

The insulating layer OIL may receive therein at least some of the layers located between the base layer 110 and the first electrode AE. Specifically, the insulating layer OIL may receive therein at least some of the layers between the first power electrode PE1 and the first electrode AE. For example, the insulating layer OIL may receive therein the seventh insulating layer 70, the eighth insulating layer 80, or both the seventh insulating layer 70 and the eighth insulating layer 80.

The insulating layer OIL may extend from the first area 110A1 to the second area 110A2 and may overlap the first power electrode PE1. The insulating layer OIL may cover an entirety of an overlapping portion OLP of the first power electrode PE1 overlapping the second electrode CE. Further, an entirety of a portion CE_P of the second electrode CE located between a boundary CE_B of the first area 110A1 and the second area 110A2 and an edge CE_E of the second electrode CE may overlap with the insulating layer OIL. The portion CE_P of the second electrode CE may be spaced apart from the overlapping portion OLP of the first power electrode PE1 while the insulating layer OIL is interposed therebetween.

A portion of the insulating layer OIL covering the overlapping portion OLP of the first power electrode PE1 may have a flat upper surface OILup. A thickness TK of the portion of the insulating layer OIL covering the overlapping portion OLP of the first power electrode PE1 may be in a range of 0.7 micrometers to 3 micrometers. Even when a particle, for example, a silver particle, located between the first power electrode PE1 and the second electrode CE is oxidized so as to expand in volume, an electric field generated between the silver particle and the second electrode CE may be smaller than several tens of MV/m. Therefore, a burnt defect due to the electric field caused by the silver particles may be reduced. Further, a phenomenon that the encapsulation layer 150 is stripped due to the burnt defect may be reduced. Therefore, product reliability of the display device 1000 (refer to FIG. 1) may be improved.

The pixel defining film PDL may be located in the first area 110A1 and the second area 110A2. The pixel defining film PDL may overlap with the overlapping portion OLP of the first power electrode PE1. A portion of the pixel defining film PDL overlapping the overlapping portion OLP of the first power electrode PE1 may have a flat upper surface PDLup.

The second electrode layer PE1*b* may further extend beyond than the first electrode layer PE1*a*. A plurality of dams DM1, DM2, and DM3 may be located on the second electrode layer PE1*b*. FIG. 7 shows three dams DM1, DM2, and DM3 by way of example. However, embodiments according to the present disclosure are not particularly limited thereto. Some of the three dams DM1, DM2, and DM3 may be omitted or further dams may be added.

Figure 8:
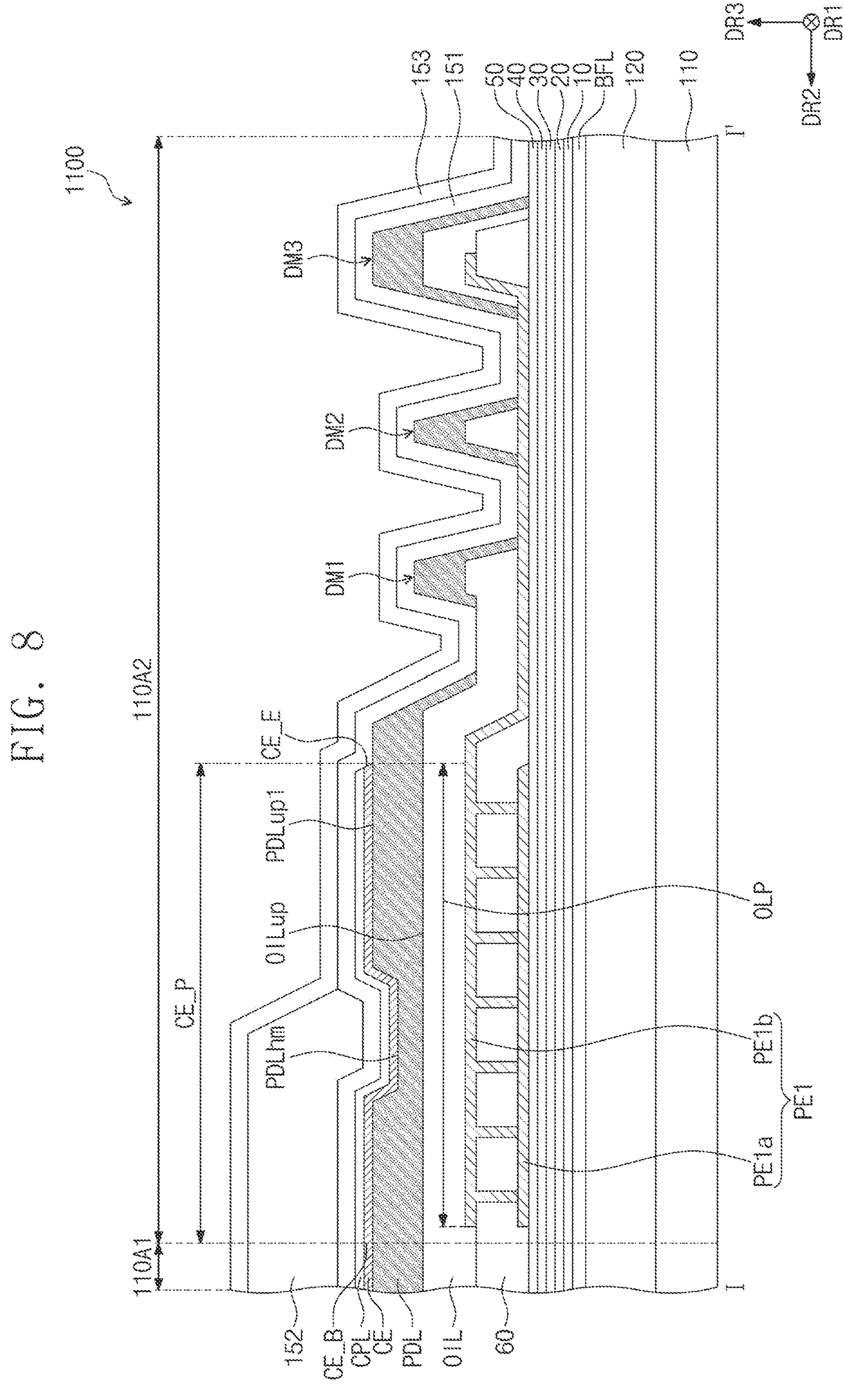
FIG. 8 is a cross-sectional view of a display panel according to some embodiments of the present disclosure.

FIG. 8 is a cross-sectional view of the display panel 1100 according to some embodiments of the present disclosure. In describing FIG. 8, the same reference numerals are allocated to the same components as those in FIG. 7, and the description thereof is omitted.

Referring to FIG. 8, a concave groove PDLhm may be defined in an upper surface PDLup1 of a portion of the pixel defining film PDL overlapping the overlapping portion OLP of the first power electrode PE1. Some of the monomers may be accommodated in the concave groove PDLhm during a process of forming the organic encapsulation layer 152. Thus, flow of the monomers may be first controlled by the groove PDLhm.

FIG. 8 shows that one concave groove PDLhm is defined in the upper surface PDLup1 of the overlapping portion of the pixel defining film PDL by way of example. However, embodiments according to the present disclosure are not particularly limited thereto. For example, one or more concave grooves PDLhms may be defined in the upper surface PDLup1 of the portion of the pixel defining film PDL.

Figure 9:
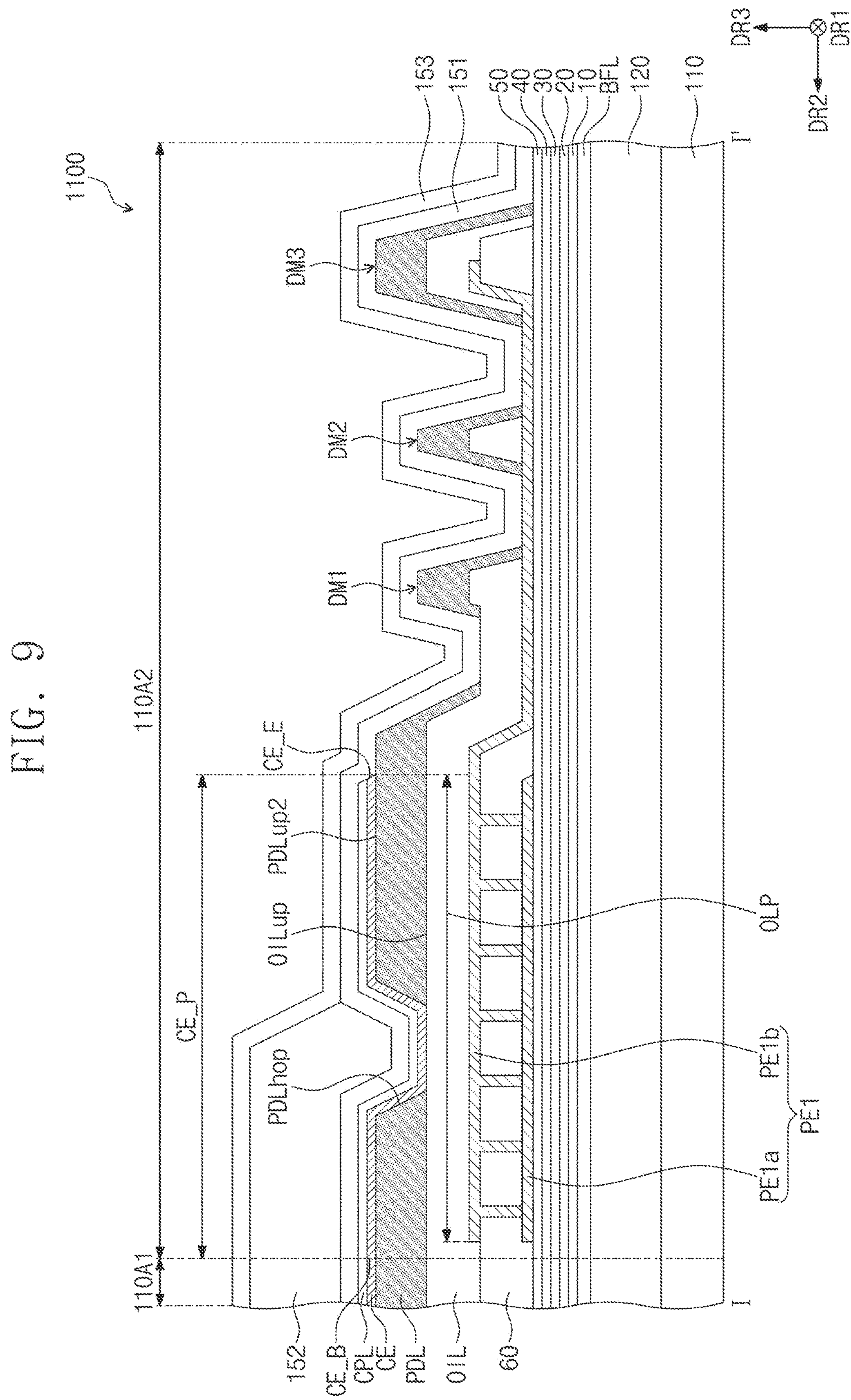
FIG. 9 is a cross-sectional view of a display panel according to some embodiments of the present disclosure.

FIG. 9 is a cross-sectional view of the display panel 1100 according to some embodiments of the present disclosure. In describing FIG. 9, the same reference numerals are allocated to the same components as those in FIG. 7, and the description thereof is omitted.

Referring to FIG. 9, an opening PDLhop may be defined in a portion of the pixel defining film PDL overlapping the overlapping portion OLP of the first power electrode PE1. Some of the monomers may be accommodated in the opening PDLhop during the process of forming the organic encapsulation layer 152. Therefore, the flow of the monomers may be first controlled by the opening PDLhop. In FIG. 9, the pixel defining film PDL has an upper surface PDLup2.

In FIG. 9, it is illustrated by way of example that one opening PDLhop is defined in the overlapping portion of the pixel defining film PDL. However, embodiments according to the present disclosure are not particularly limited thereto. For example, one or more openings PDLhop may be defined in the portion of the pixel defining film PDL.

Figure 10:
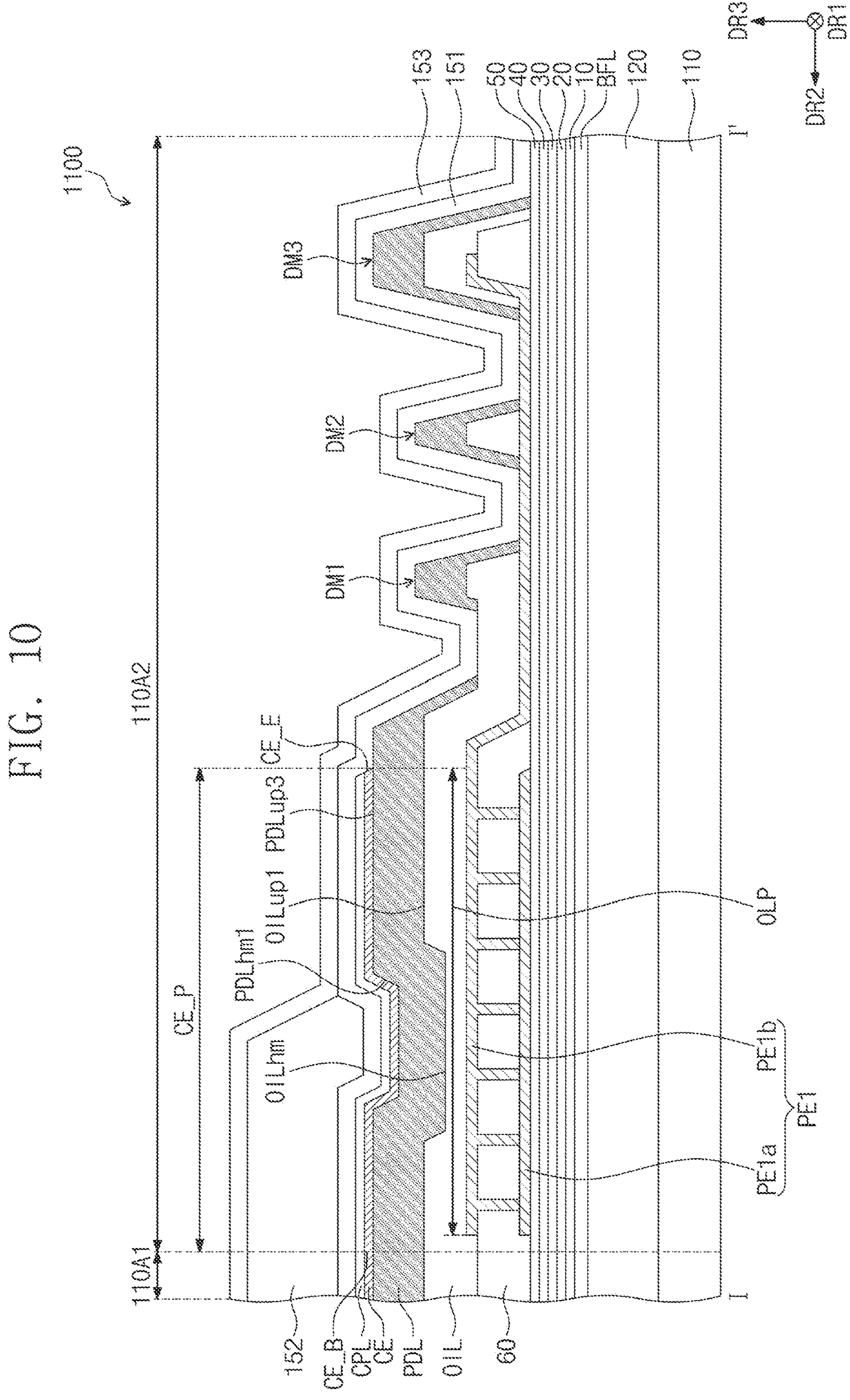
FIG. 10 is a cross-sectional view of a display panel according to some embodiments of the present disclosure.

FIG. 10 is a cross-sectional view of the display panel 1100 according to some embodiments of the present disclosure. In describing FIG. 10, the same reference numerals are allocated to the same components as those in FIG. 7, and the description thereof is omitted.

Referring to FIG. 10, a concave groove OILhm may be defined in the upper surface OILup1 of the insulating layer OIL. A concave groove PDLhm1 may also be defined in the upper surface PDLup3 of the pixel defining film PDL in a corresponding manner to a shape of the upper surface OILup1 of the insulating layer OIL.

Figure 11:
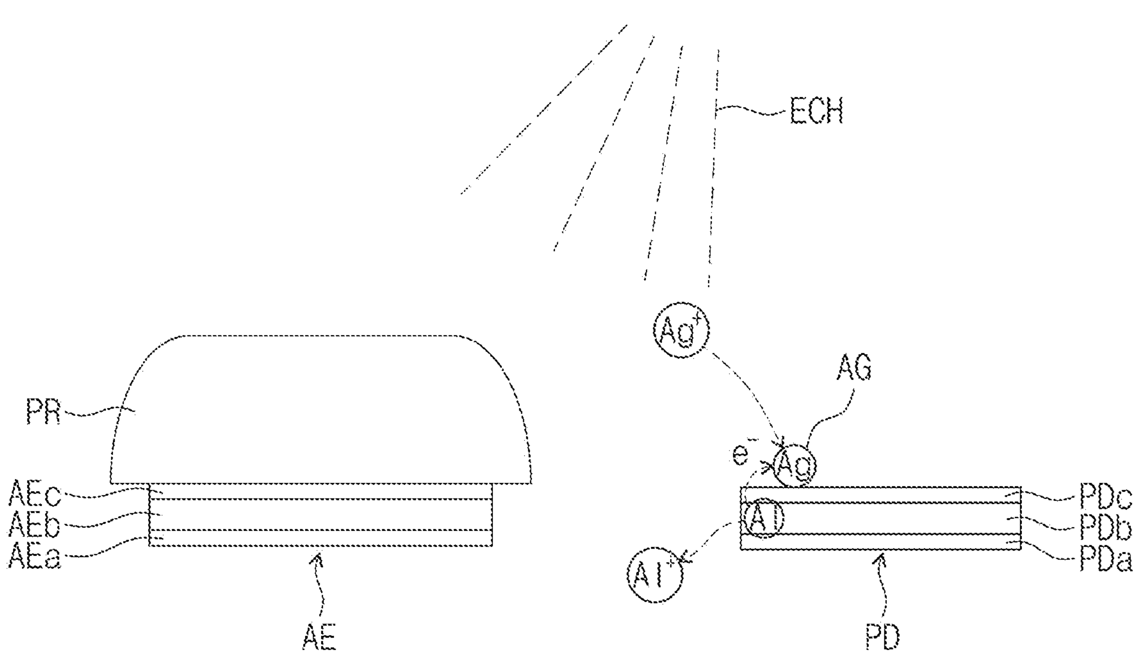
FIG. 11 is a diagram schematically showing a portion of a manufacturing process of a display panel according to some embodiments of the present disclosure.

FIG. 11 is a diagram schematically showing a portion of a manufacturing process of a display panel according to some embodiments of the present disclosure.

Referring to FIG. 3, FIG. 5, and FIG. 11, the first electrode AE may have a three-layer structure. For example, the first electrode AE may include a first electrode layer AEa including indium tin oxide, a second electrode layer AEb including silver, and a third electrode layer AEc including indium tin oxide.

A pad PD may have a three-layer structure. The pad PD may have the same stack structure as that of the second electrode layer PE1*b*. For example, the pad PD may include a first electrode layer PDa including titanium, a second electrode layer PDb including aluminum, and a third electrode layer PDc including titanium.

FIG. 11 shows the first electrode AE and the pad PD formed during a patterning process of the first electrode AE. A photoresist layer PR may be located on a conductive layer, and then, the first electrode AE may be formed by patterning the conductive layer. An etchant ECH may be provided to pattern the conductive layer. The etchant ECH may include an oxidizing agent, a dissociating agent, an additive, and $CH_3COOH$. For example, the oxidizing agent may be $HNO_3$ and the dissociating agent may be $H_3PO_4$.

When the first electrode AE is formed, the pad PD may be exposed to the etchant ECH to cause a galvanic reaction. For example, silver ($Ag^+$) in a hydrate state may receive electrons ($e^-$) of aluminum (Al) included in the second electrode layer PDb, and thus may be reduced to silver (Ag), such that a silver particle AG may be precipitated. The silver particle AG may be adsorbed on the third electrode layer PDc. Thereafter, during a cleaning process, the silver particle AG attached to the pad PD may be transferred into a pattern.

Figure 12A:
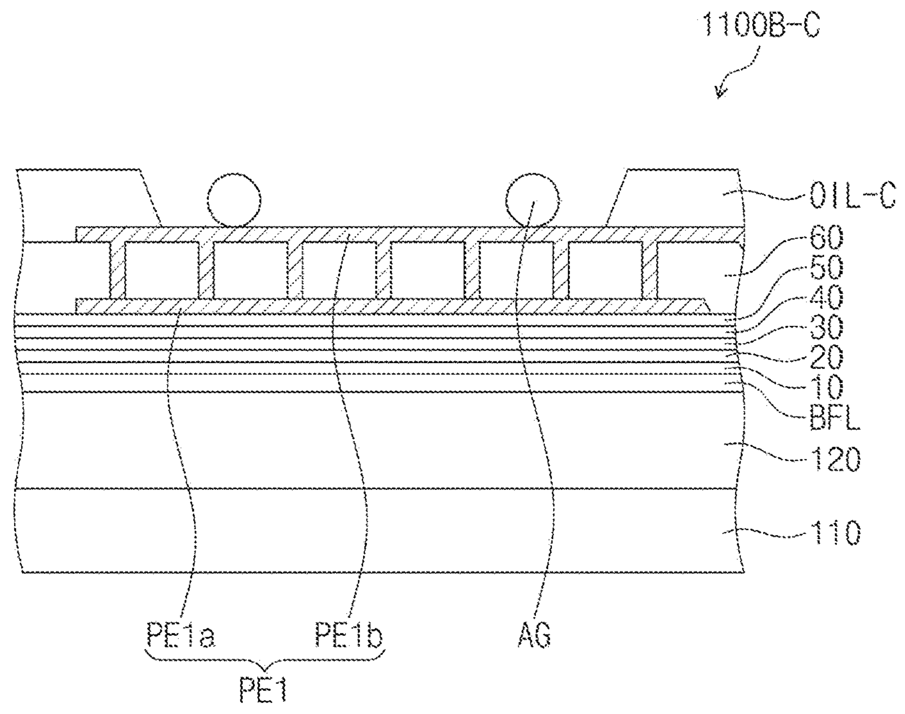
FIG. 12A is a cross-sectional view showing a display panel during a manufacturing process according to a comparative example of the present disclosure.
Figure 12B:
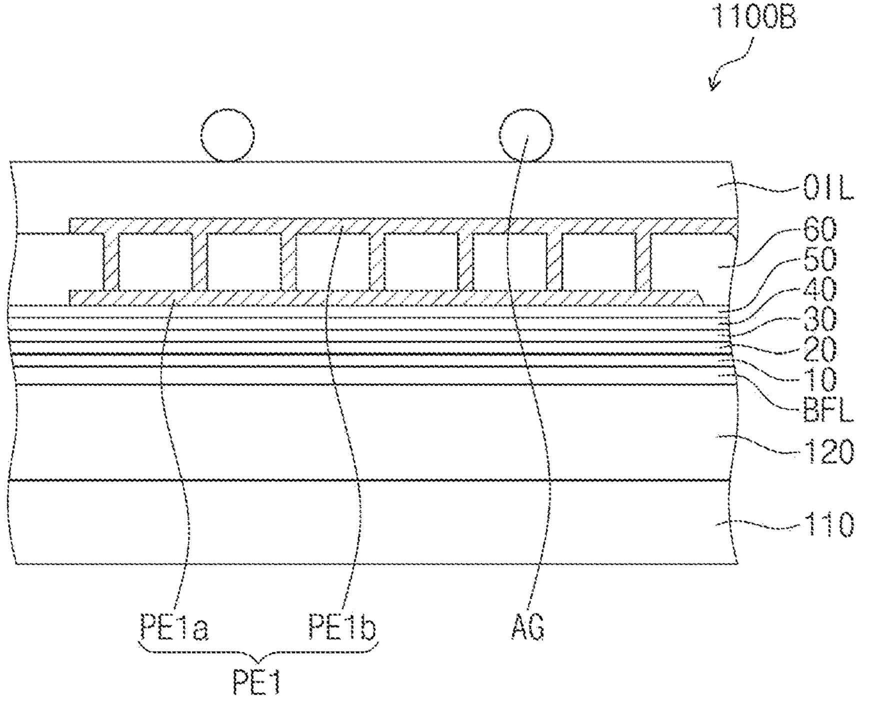
FIG. 12B is a cross-sectional view showing a display panel during a manufacturing process according to some embodiments of the present disclosure.

FIG. 12A is a cross-sectional view showing a display panel 1100B-C during a manufacturing process according to a comparative example of the present disclosure. FIG. 12B is a cross-sectional view showing a display panel 1100B during a manufacturing process according to some embodiments of the present disclosure.

FIG. 12A shows a state in which the silver particle AG is transferred onto the first power electrode PE1 of the display panel 1100B-C during the manufacturing process according to the comparative example. FIG. 12B shows a state in which the silver particle AG is transferred to an area overlapping the first power electrode PE1 of the display panel 1100B during the manufacturing process according to some embodiments of the present disclosure.

Referring to FIG. 7, FIG. 12A, and FIG. 12B together, the silver particle AG transferred to the area overlapping the first power electrode PE1 may not be sufficiently covered with the pixel defining film PDL, the second electrode CE, and capping layer CPL. In this case, the silver particle AG may be in an exposed state in forming the first sub-inorganic encapsulation layer 1511 (refer to FIG. 6).

The first sub-inorganic encapsulation layer 1511 may be formed via the chemical vapor deposition method in an environment with a relatively higher oxygen content than that of each of the second sub-inorganic encapsulation layer 1512 and the third sub-inorganic encapsulation layer 1513. During the process of forming the first sub-inorganic encapsulation layer 1511, the exposed silver particle AG may be oxidized such that a volume of the silver particle AG may expand.

According to the comparative example as shown in FIG. 12A, the first power electrode PE1 of the display panel 1100B-C may not be entirely covered with an insulating layer OIL-C and thus be partially exposed. The second electrode layer PE1*b* of the first power electrode PE1 may have the same stack structure as that of the pad PD. That is, the second electrode layer PE1*b* may have a three-layer structure of a titanium layer/an aluminum layer/a titanium layer. During the cleaning process, the silver particle AG attached to the pad PD may be transferred onto the first power electrode PE1.

According to the comparative example of the present disclosure, the silver particle AG may be electrically connected to the first power electrode PE1. Because the silver particle AG is in contact with the first power electrode PE1, the volume expansion of the silver particle AG may cause a distance between the first power electrode PE1 and the second electrode CE to become smaller. Therefore, a defect in which the first power electrode PE1 and the second electrode CE are short-circuited with each other may occur due to increase in the electric field resulting from the decrease in the distance. Further, the burnt defect due to the short-circuit may cause the first sub-inorganic encapsulation layer 1511 to be stripped.

According to some embodiments of the present disclosure as shown in FIG. 12B, an area of the first power electrode PE1 overlapping the second electrode CE may be entirely covered with the insulating layer OIL. Therefore, even when the silver particle AG is transferred to an area overlapping the first power electrode PE1 during the cleaning process, the silver particle AG and the first power electrode PE1 may be electrically insulated from each other via the insulating layer OIL. That is, even when the silver particle AG is oxidized such that the volume thereof expands, the silver particle AG may be electrically insulated from the first power electrode PE1 and the second electrode CE. Therefore, even when a voltage is applied to the first power electrode PE1 and the second electrode CE, the short-circuit may not occur and thus the burnt defect may be reduced or eliminated. Therefore, product reliability of the display device 1000 (refer to FIG. 1) may be improved.

According to the foregoing, the insulating layer located under the first electrode of the light-emitting element may cover the first power electrode. In particular, the entirety of the portion of the first power electrode overlapping the second electrode of the light-emitting element may be covered with the insulating layer. Therefore, even when the silver particle is transferred to the area overlapping the first power electrode during the cleaning process, the silver particle and the first power electrode may be electrically insulated from each other via the insulating layer. Even when the silver particle is oxidized so as to expand in volume, the silver particle may be electrically insulated from the first power electrode and the second electrode. Therefore, even when a voltage is applied to the first power electrode and the second electrode, burnt defects due to the electric field may be reduced or eliminated. Therefore, product reliability of the display device may be relatively improved.

Further, the encapsulation layer may include the first inorganic encapsulation layer, the organic encapsulation layer, and the second inorganic encapsulation layer. The first inorganic encapsulation layer may have a multi-layer structure in which the layer of the low refractive index, the layer of the high refractive index, and the layer of the low refractive index are stacked. As the encapsulation layer has a strong resonance structure, the light emission efficiency at which the light is emitted from the light-emitting layer may be improved, and accordingly, power consumption of the display device may be reduced. Further, because the light extraction efficiency is improved, the lifetime of the display device at a room temperature may be improved.

While aspects of some embodiments of the present disclosure have been described with reference to some embodiments thereof, it will be apparent to those of ordinary skill in the art that various changes and modifications may be made thereto without departing from the spirit and scope of the present disclosure as set forth in the following claims, and their equivalents.

What is claimed is:

1. A display device comprising:

a base layer having a first area and a second area;

a pixel on the first area, wherein the pixel includes a pixel circuit and a light-emitting element, wherein the light-emitting element includes a first electrode, a light-emitting layer, and a second electrode;

a first power electrode on the second area and configured to supply a first drive voltage to the pixel circuit;

a second power electrode on the second area and configured to supply a second drive voltage to the second electrode;

an insulating layer between the base layer and the first electrode, wherein the insulating layer extends from the first area to the second area, and overlaps the first power electrode, wherein the first power electrode includes a first electrode layer and a second electrode layer disposed on the first electrode layer and electrically connected to the first electrode layer, wherein the second electrode extends from the first area toward the second area, wherein the insulating layer is disposed on the first power electrode and covers an entirety of an overlapping portion of the first power electrode overlapping the second electrode, and wherein the overlapping portion includes a first overlapping portion of the first electrode layer overlapping the second electrode and a second overlapping portion of the second electrode layer overlapping the second electrode.

2. The display device of claim 1, wherein the insulating layer includes an organic material.

3. The display device of claim 1, wherein a thickness of a portion of the insulating layer covering the overlapping portion of the first power electrode is 0.7 micrometers or greater.

4. The display device of claim 1, further comprising a pixel defining film on the insulating layer, wherein an opening exposing a portion of the first electrode is defined in the pixel defining film, wherein the pixel defining film overlaps the overlapping portion of the first power electrode.

5. The display device of claim 4, wherein a portion of the pixel defining film overlapping the overlapping portion of the first power electrode has a flat upper surface.

6. The display device of claim 4, wherein a concave groove is defined in an upper surface of a portion of the pixel defining film overlapping the overlapping portion of the first power electrode.

7. The display device of claim 1, wherein a portion of the insulating layer covering the overlapping portion of the first power electrode has a flat upper surface.

8. The display device of claim 1, further comprising a capping layer on the second electrode.

9. The display device of claim 1, further comprising an encapsulation layer on the first area and the second area so as to cover the pixel, at least a portion of the first power electrode, and at least a portion of the second power electrode, wherein the encapsulation layer includes:

a first inorganic encapsulation layer;

an organic encapsulation layer on the first inorganic encapsulation layer; and a second inorganic encapsulation layer on the organic encapsulation layer.

10. The display device of claim 9, wherein the first inorganic encapsulation layer includes:

a first sub-inorganic encapsulation layer having a first refractive index;

a second sub-inorganic encapsulation layer on the first sub-inorganic encapsulation layer and having a second refractive index different from the first refractive index; and a third sub-inorganic encapsulation layer on the second sub-inorganic encapsulation layer and having a third refractive index different from the first and second refractive indices, wherein the first refractive index is lower than each of the second refractive index and the third refractive index.

11. The display device of claim 10, wherein the third refractive index is lower than the second refractive index.

12. The display device of claim 10, wherein a thickness of the first sub-inorganic encapsulation layer is smaller than a thickness of the second sub-inorganic encapsulation layer and is greater than a thickness of the third sub-inorganic encapsulation layer.

13. The display device of claim 10, wherein a refractive index of the second inorganic encapsulation layer is equal to the second refractive index of the second sub-inorganic encapsulation layer.

14. The display device of claim 1, wherein the second electrode layer has a three-layer structure of a titanium layer/an aluminum layer/a titanium layer, and wherein the first electrode includes an electrode layer having a three-layer structure of an indium tin oxide layer/a silver layer/an indium tin oxide layer.

15. A display device comprising:

a display panel having a display area and a non-display area, wherein the display panel includes:

a base layer;

a circuit layer on the base layer, wherein the circuit layer includes a pixel circuit, a first power electrode, a second power electrode, and an insulating layer covering the pixel circuit, the first power electrode, and the second power electrode;

an element layer on the circuit layer, and electrically connected to the pixel circuit, wherein the element layer includes a light-emitting element including a first electrode, a light-emitting layer, and a second electrode; and an encapsulation layer covering the element layer, wherein the first power electrode includes a first electrode layer and a second electrode layer disposed on the first electrode layer and electrically connected to the first electrode layer, wherein the encapsulation layer includes:

a first inorganic encapsulation layer including a plurality of sub-inorganic encapsulation layers having different refractive indices;

an organic encapsulation layer on the first inorganic encapsulation layer; and a second inorganic encapsulation layer on the organic encapsulation layer, wherein in the non-display area, the insulating layer is disposed on the first power electrode and covers an entirety of an overlapping portion of the first power electrode overlapping the second electrode, and wherein the overlapping portion includes a first overlapping portion of the first electrode layer overlapping the second electrode and a second overlapping portion of the second electrode layer overlapping the second electrode.

16. The display device of claim 15, wherein the plurality of sub-inorganic encapsulation layers further includes:

a first sub-inorganic encapsulation layer on the element layer and having a first refractive index;

a second sub-inorganic encapsulation layer on the first sub-inorganic encapsulation layer and having a second refractive index higher than the first refractive index; and a third sub-inorganic encapsulation layer on the second sub-inorganic encapsulation layer and having a third refractive index higher than the first refractive index and lower than the second refractive index.

17. The display device of claim 15, wherein the first power electrode transfers a first drive voltage to the pixel circuit, and wherein the second power electrode transfers a second drive voltage to the second electrode.

18. The display device of claim 15, wherein the insulating layer is made of an organic material, and wherein a thickness of a portion of the insulating layer between the second electrode and the first power electrode is 0.7 micrometer or greater.

19. The display device of claim 15, wherein the display panel further includes a pixel defining film on the circuit layer, wherein an opening exposing a portion of the first electrode is defined in the pixel defining film, and wherein the pixel defining film overlaps the overlapping portion of the first power electrode.

20. The display device of claim 19, wherein a portion of the pixel defining film overlapping the overlapping portion of the first power electrode has a flat upper surface.

21. The display device of claim 19, wherein a concave groove is defined in an upper surface of a portion of the pixel defining film overlapping the overlapping portion of the first power electrode.

22. The display device of claim 15, wherein the first power electrode includes an electrode layer having a three-layer structure of a titanium layer/an aluminum layer/a titanium layer, and wherein the first electrode includes an electrode layer having a three-layer structure of an indium tin oxide layer/a silver layer/an indium tin oxide layer.

23. An electronic device comprising:

a base layer having a first area and a second area;

a pixel on the first area, wherein the pixel includes a pixel circuit and a light-emitting element, wherein the light-emitting element includes a first electrode, a light-emitting layer, and a second electrode;

a first power electrode on the second area and configured to supply a first drive voltage to the pixel circuit;

a second power electrode on the second area and configured to supply a second drive voltage to the second electrode;

an insulating layer between the base layer and the first electrode, wherein the insulating layer extends from the first area to the second area, and overlaps the first power electrode, wherein the first power electrode includes a first electrode layer and a second electrode layer disposed on the first electrode layer and electrically connected to the first electrode layer, wherein an entirety of a portion of the second electrode between a boundary of the first area and the second area and an edge of the second electrode overlaps the insulating layer, wherein the portion of the second electrode is spaced apart from the first power electrode while the insulating layer is interposed therebetween, and wherein the insulating layer is disposed on the first power electrode and covers an entirety of a first overlapping portion of the first electrode layer overlapping the second electrode and an entirety of a second overlapping portion of the second electrode layer overlapping the second electrode.

24. The display electronic device of claim 23, further comprising an encapsulation layer on the first area and the second area so as to cover the pixel, at least a portion of the first power electrode, and at least a portion of the second power electrode, wherein the encapsulation layer includes:

a first inorganic encapsulation layer including a plurality of sub-inorganic encapsulation layers having different refractive indices;

an organic encapsulation layer on the first inorganic encapsulation layer; and a second inorganic encapsulation layer on the organic encapsulation layer, wherein the plurality of sub-inorganic encapsulation layers includes:

a first sub-inorganic encapsulation layer having a first refractive index;

a second sub-inorganic encapsulation layer on the first sub-inorganic encapsulation layer and having a second refractive index, the second refractive index being higher than the first refractive index; and a third sub-inorganic encapsulation layer on the second sub-inorganic encapsulation layer and having a third refractive index higher than the first refractive index and lower than the second refractive index.

* * * * *